United States Patent
Wu et al.

(10) Patent No.: US 11,164,592 B1
(45) Date of Patent: Nov. 2, 2021

(54) RESPONSIVE AUTOMATIC GAIN CONTROL

(71) Applicant: Amazon Technologies, Inc., Seattle, WA (US)

(72) Inventors: Biqing Wu, Bellevue, WA (US); Phil Hetherington, Bellevue, WA (US); Carlo Murgia, Seattle, WA (US); Rong Hu, San Jose, CA (US)

(73) Assignee: Amazon Technologies, Inc., Seattle, WA (US)

( * ) Notice: Subject to any disclaimer, the term of this patent is extended or adjusted under 35 U.S.C. 154(b) by 83 days.

(21) Appl. No.: 16/408,267

(22) Filed: May 9, 2019

(51) Int. Cl.
*G10L 21/034* (2013.01)
*G10L 15/22* (2006.01)
*G10L 25/60* (2013.01)
*G10L 25/84* (2013.01)

(52) U.S. Cl.
CPC .......... *G10L 21/034* (2013.01); *G10L 15/22* (2013.01); *G10L 25/60* (2013.01); *G10L 25/84* (2013.01)

(58) Field of Classification Search
None
See application file for complete search history.

(56) References Cited

U.S. PATENT DOCUMENTS

| | | | | |
|---|---|---|---|---|
| 6,415,029 B1* | 7/2002 | Piket | | H04B 3/234 |
| | | | | 379/406.01 |
| 8,271,276 B1* | 9/2012 | Muesch | | G10L 25/78 |
| | | | | 704/225 |
| 9,537,460 B2* | 1/2017 | Yeldener | | H03G 3/3005 |
| 2002/0019733 A1* | 2/2002 | Erell | | H03G 7/007 |
| | | | | 704/225 |
| 2006/0018460 A1* | 1/2006 | McCree | | H04M 9/082 |
| | | | | 379/406.08 |
| 2008/0228473 A1* | 9/2008 | Kinoshita | | G10L 21/0208 |
| | | | | 704/225 |
| 2010/0198590 A1* | 8/2010 | Tackin | | H04L 12/6418 |
| | | | | 704/214 |
| 2014/0278383 A1* | 9/2014 | Fan | | H03G 3/00 |
| | | | | 704/224 |
| 2016/0118062 A1* | 4/2016 | Usher | | H03G 3/341 |
| | | | | 704/225 |
| 2017/0011753 A1* | 1/2017 | Herbig | | H03G 3/3089 |
| 2018/0309421 A1* | 10/2018 | Smith | | H03G 3/32 |

\* cited by examiner

*Primary Examiner* — Pierre Louis Desir
*Assistant Examiner* — Nicole A K Schmieder
(74) *Attorney, Agent, or Firm* — Pierce Atwood LLP

(57) ABSTRACT

A system that performs automatic gain control (AGC) using different decay rates. The system may select a slow decay rate to track a loudness level within speech (e.g., within an utterance), improving audio quality and maintaining dynamic range for an individual voice, while selecting a fast decay rate to track the loudness level after a gap of silence (e.g., no voice activity detected for a duration of time) or during large level changes (e.g., actual speech loudness is lower than estimated speech loudness for a duration of time). This improves an accuracy of the loudness estimate and therefore a responsiveness of the automatic gain control, resulting in an improved user experience.

20 Claims, 19 Drawing Sheets

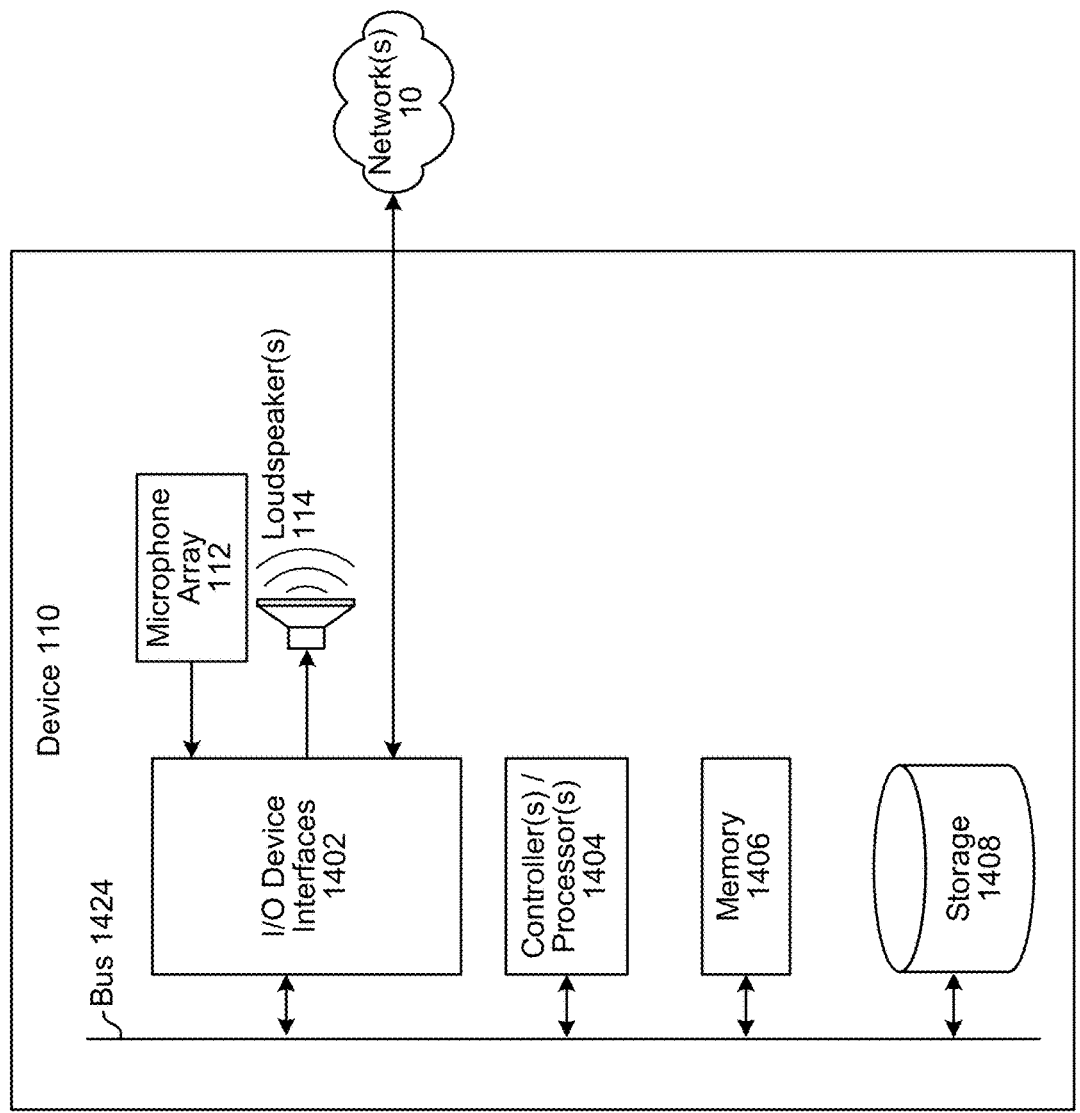

RESPONSIVE AUTOMATIC GAIN CONTROL

BACKGROUND

With the advancement of technology, the use and popularity of electronic devices has increased considerably. Electronic devices are commonly used to receive audio data and generate output audio based on the received audio data. Described herein are technological improvements to such systems, among other things.

BRIEF DESCRIPTION OF DRAWINGS

For a more complete understanding of the present disclosure, reference is now made to the following description taken in conjunction with the accompanying drawings.

FIG. 14 is a block diagram conceptually illustrating example components of a system according to embodiments of the present disclosure.

DETAILED DESCRIPTION

Figure 1:
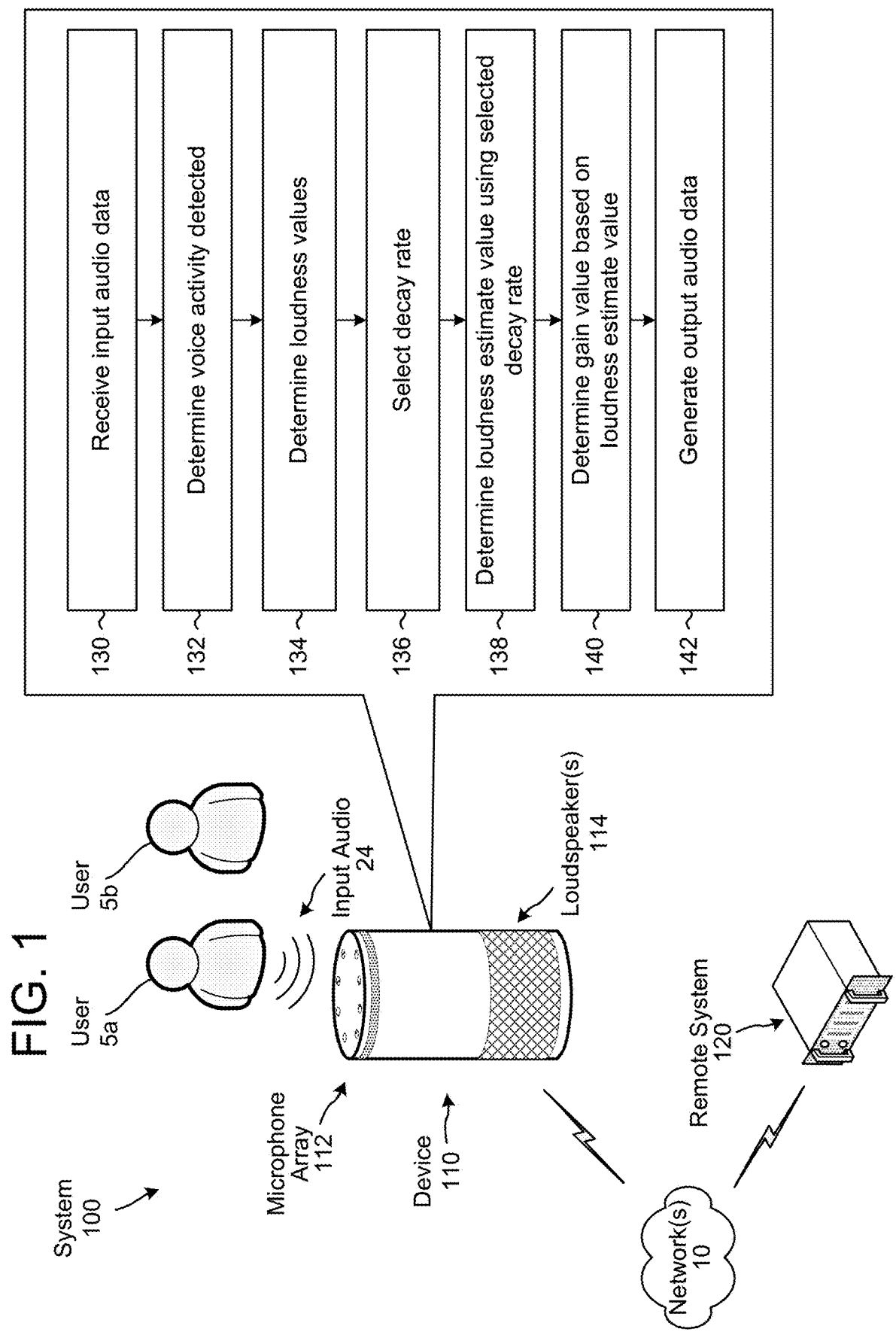
FIG. 1 illustrates a system for performing automatic gain control according to embodiments of the present disclosure.

Electronic devices may be used to capture input audio, such as speech, by generating input audio data corresponding to the input audio. For example, an electronic device may include microphones that capture speech during a conversation, such as a conference call or other communication session. The input audio data may have large level changes (e.g., large changes in volume) between different voices during the conversation, caused by variations in loudness between individual users and/or a distance between the microphones and the user. For example, a first portion of the input audio data may correspond to a loud talker positioned close to the microphones and may have a high volume level (e.g., extremely loud volume), whereas a second portion of the audio data may correspond to a quiet talker and may have a low volume level (e.g., quiet volume).

However, a listener may prefer a consistent and balanced loudness experience (e.g., audio at a consistent volume level) regardless of the level changes that occur in the input audio data. Some devices maintain a consistent volume level by performing automatic volume leveling (AVL) to boost the input audio data to a desired volume level. For example, AVL may modify the input audio data so that both the first portion and the second portion have a desired volume level. Thus, output audio data will maintain a consistent volume level when transitioning between the first portion and the second portion.

While AVL maintains a consistent volume level, conventional techniques may be slow to respond to large level changes corresponding to different voices. For example, conventional techniques may track a loudness level of the input audio data using a slow decay rate, which prevents rapid fluctuations in gain values or other sources of distortion. In particular, the slow decay rate provides consistent volume leveling for an individual talker, maintaining dynamic range by capturing normal variations in speech volume. While performing AVL improves a user experience by removing sudden changes in volume level within the output audio without compressing the dynamic range, using the slow decay rate may result in a lack of responsiveness during large level changes such as transitions between different voices. However, while a faster decay rate may improve responsiveness during large level changes, the faster decay rate reduces a dynamic range associated with an individual voice and changes a spectrum of the voice, acting as a dynamic range compressor and decreasing audio quality as every word in an utterance is output at the desired volume level.

To improve a user experience and sound quality of audio data, devices, systems and methods are disclosed that perform automatic gain control (AGC) using different decay rates. For example, the system may use the slow decay rate to track a loudness level within speech (e.g., within an utterance and/or while a specific voice is speaking), improving audio quality and maintaining dynamic range for an individual voice, while using the fast decay rate to track the loudness level after a gap of silence (e.g., no voice activity detected for a duration of time) and/or during large level changes (e.g., actual speech loudness is lower than estimated speech loudness for a duration of time). This improves an accuracy of the loudness estimate and therefore a responsiveness of the automatic gain control, resulting in an improved user experience.

FIG. 1 illustrates a system for performing automatic gain control according to embodiments of the present disclosure. As illustrated in FIG. 1, a system 100 may include a device 110 and/or server(s) 120 that may communicate via network(s) 10. While FIG. 1 illustrates the device 110 being a speech controlled device, the disclosure is not limited thereto and the system 100 may include any device capable of generating audio data. As illustrated in FIG. 1, the device 110 may include a microphone array 112 and one or more loudspeaker(s) 114.

The device 110 may be configured to capture input audio 24 by generating input audio data using the microphone array 112. The device 110 may perform automatic gain control (AGC) and other audio processing to generate output audio data by adjusting a level of the input audio data to a predefined level. In some examples, the device 110 may send the output audio data to the remote system 120 during a communication session (e.g., conference call or the like), although the disclosure is not limited thereto.

The input audio data may have large volume level changes between different voices (e.g., different users) or the like. For example, a first portion of the input audio data may correspond to a first user 5a, while a second portion of the input audio data may correspond to a second user 5b. However, a listener (e.g., user of a remote device) may prefer a consistent and balanced loudness experience (e.g., consistent volume level) regardless of the level changes that occur in the input audio data.

To maintain a consistent volume level between different portions of the input audio data, the device 110 may perform automatic gain control (AGC) to boost or attenuate the input audio data to a desired volume level. For example, the first portion of the input audio data may correspond to the first user 5a and may have a first energy level (e.g., first volume level), whereas the second portion of the input audio data may correspond to the second user 5b and may have a second energy level (e.g., second volume level) that is very different from the first energy level. If the device 110 generated output audio without performing AGC to modify the input audio data, the first portion may be extremely loud and the second portion may be quiet, or vice versa. Instead, the device 110 may perform AGC to modify the input audio data so that both the first portion and the second portion have a third volume level (e.g., desired volume level). Thus, the output audio data will maintain a consistent volume level when transitioning between the first portion and the second portion.

To improve a user experience and a sound quality of the output audio data, the device 110 may perform AGC using different decay rates. For example, the device 110 may use the slow decay rate to track a loudness level within speech (e.g., within an utterance and/or while a specific voice is speaking), improving audio quality and maintaining dynamic range for an individual voice, while using the fast decay rate to track the loudness level after a gap of silence (e.g., no voice activity detected for a duration of time) and/or during large level changes (e.g., actual speech loudness is lower than estimated speech loudness for a duration of time). This improves an accuracy of the loudness estimate and therefore a responsiveness of the automatic gain control, resulting in an improved user experience.

As illustrated in FIG. 1, the device 110 may receive (130) input audio data and may determine (132) whether voice activity is detected in individual audio frames of the input audio data. For example, the device 110 may perform voice activity detection, as described in greater detail below with regard to FIG. 2.

The device 110 may determine (134) loudness values associated with individual audio frames, may select (136) a decay rate, and may determine (138) a loudness estimate value using the selected decay rate. For example, the device 110 may determine the loudness estimate value using a slow decay rate within an utterance, but may switch to a fast decay rate after a silence gap or when the instant loudness values are consistently below the loudness estimate, as described in greater detail below with regard to FIGS. 4-6. As used herein, instant loudness values may refer to instantaneous loudness values, although a duration of time associated with the instant loudness values may vary without departing from the disclosure.

The device 110 may determine (140) a gain value based on the loudness estimate value may then generate (142) output audio data using the gain value and the input audio data. For example, the device 110 may determine the gain value in decibels (dB) by calculating a difference between a target loudness value and the loudness estimate value. The device 110 may determine the target loudness value based on a fixed value (e.g., 0 dB), a gain curve, and/or using other techniques known to one of skill in the art.

The device 110 may continue to perform the steps illustrated in FIG. 1 to generate the output audio data. For example, as the input energy levels of the input audio data change, the device 110 may determine a current loudness estimate value and update the gain value with a new gain value that corresponds to the current loudness estimate value. In some examples, the target loudness value is not a fixed value and the device 110 may receive an indication of a change in a volume index value or another parameter that causes the device 110 to update the gain curve and determine a new gain value using the updated gain curve.

As used herein, an input energy level corresponds to a value of the input audio data at a particular point in time (e.g., sound level). Thus, the input energy level may correspond to air pressure (e.g., sound pressure), displacement, power, voltage, intensity, amplitude, and/or the like and is associated with different volume levels of the output audio (e.g., larger energy level corresponds to a higher volume level). Energy levels may be illustrated using decibels (dB), although the disclosure is not limited thereto and energy levels may be measured using any technique known to one of skill in the art.

A gain value is an amount of gain (e.g., amplification or attenuation) to apply to the input audio data to generate output audio data. For example, the device 110 may apply the gain value to the input audio data to generate output audio data. A positive dB gain value corresponds to amplification (e.g., increasing a power or amplitude of the output audio data relative to the input audio data), whereas a negative dB gain value corresponds to attenuation (decreasing a power or amplitude of the output audio data relative to the input audio data). For example, a gain value of 6 dB corresponds to the output energy level being twice as large as the input energy level, whereas a gain value of −6 dB corresponds to the output energy level being half as large as the input energy level.

As used herein, automatic gain control (AGC) corresponds to controlling an output energy level for varying input energy levels. For example, the device 110 may measure an average amplitude of the input energy levels associated with a first time range of the input audio data and may dynamically adjust the input-to-output gain to a suitable value to generate output audio data at a desired output energy level (e.g., desired output average amplitude). The average amplitude can be a simple measurement of average power, such as a root mean square (RMS) value that is defined as a square root of mean square (e.g., arithmetic mean of squares of a set of numbers), which may also be referred to as a quadratic mean.

AGC may be correspond to loudness normalization, variable-gain amplification, volume leveling (AVL), automatic volume control (AVC), and/or automatic volume control and leveling (AVCL). However, the examples of AGC processing described herein are tailored to capturing audio (e.g., performed on input audio data generated by microphones to generate output audio data that is sent to a remote device), whereas AVL/AVC/AVCL is typically performed as part of outputting audio (e.g., performed on input audio data received from a remote device to generate output audio data that is sent to loudspeakers to generate output audio). Performing AGC may result in dynamic range compression, as AGC reduces the volume of loud sounds and amplifies quiet sounds, thus reducing or compressing the dynamic range of the output audio data relative to the input audio data.

An audio signal is a representation of sound and an electronic representation of an audio signal may be referred to as audio data, which may be analog and/or digital without departing from the disclosure. For ease of illustration, the disclosure may refer to either audio data or audio signals without departing from the disclosure. Additionally or alternatively, portions of a signal may be referenced as a portion of the signal or as a separate signal and/or portions of audio data may be referenced as a portion of the audio data or as separate audio data. For example, a first audio signal may correspond to a first period of time (e.g., time range, such as 30 seconds) and a portion of the first audio signal corresponding to a second period of time (e.g., 1 second) may be referred to as a first portion of the first audio signal or as a second audio signal without departing from the disclosure. Similarly, first audio data may correspond to the first period of time (e.g., 30 seconds) and a portion of the first audio data corresponding to the second period of time (e.g., 1 second) may be referred to as a first portion of the first audio data or second audio data without departing from the disclosure. Audio signals and audio data may be used interchangeably, as well; a first audio signal may correspond to the first period of time (e.g., 30 seconds) and a portion of the first audio signal corresponding to a second period of time (e.g., 1 second) may be referred to as first audio data without departing from the disclosure.

As used herein, audio signals or audio data may correspond to a specific range of frequency bands. For example, the audio data may correspond to a human hearing range (e.g., 20 Hz-20 kHz), although the disclosure is not limited thereto.

Figure 2:
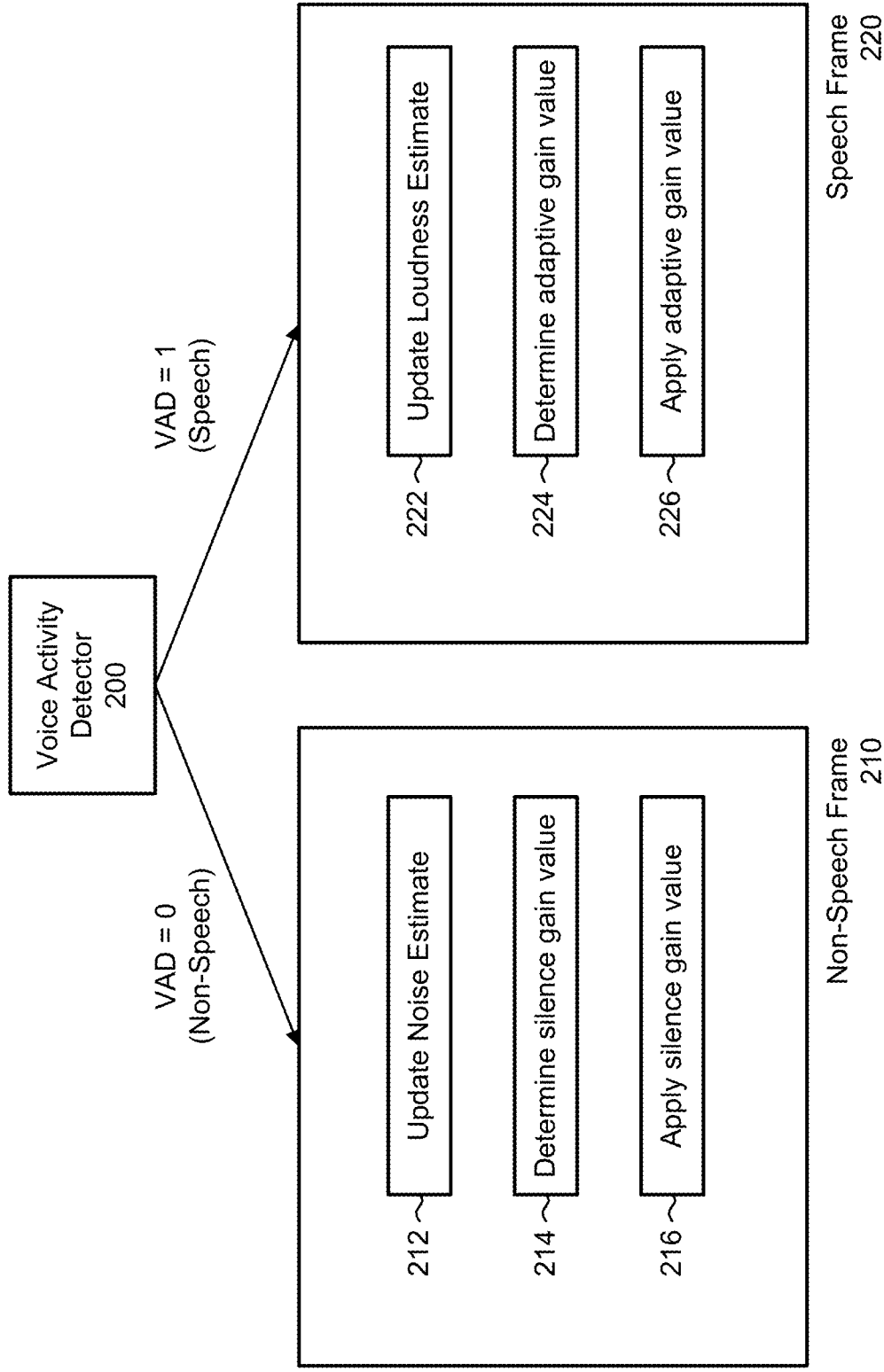
FIG. 2 illustrates an example of processing non-speech frames and speech-frames according to embodiments of the present disclosure.

FIG. 2 illustrates an example of processing non-speech frames and speech-frames according to embodiments of the present disclosure. As illustrated in FIG. 2, the device 110 may include a voice activity detector (VAD) 200 that may determine whether voice activity (e.g., speech) is detected. For example, the VAD 200 may use an instant loudness value of a current audio frame to track an upper envelope value (e.g., amplitude of the audio signal) and a lower envelope value (e.g., noise floor) and may determine whether voice activity is present by comparing the upper envelope value to the noise floor. Thus, when the upper envelope value is greater than the noise floor by more than a threshold value, the VAD 200 may determine that voice activity is detected in the current audio frame. However, the disclosure is not limited thereto and the VAD 200 may perform voice activity detection using any techniques known to one of skill in the art without departing from the disclosure.

As used herein, the loudness value may correspond to an amplitude, an average amplitude for a duration of time, and/or the like. For example, the loudness value can be a simple measurement of average power, such as a root mean square (RMS) value that is defined as a square root of mean square (e.g., arithmetic mean of squares of a set of numbers), which may also be referred to as a quadratic mean. For ease of illustration, the disclosure will refer to the loudness values as being RMS values, although the disclosure is not limited thereto.

As used herein, an instant loudness value corresponds to a single audio frame. In contrast, the VAD 200 may track loudness values for a duration of time, such that the upper envelope value and the lower envelope value may correspond to several audio frames. However, the disclosure is not limited thereto and the upper envelope value and/or the lower envelope value may correspond to a single audio frame without departing from the disclosure. In some examples, the VAD 200 may determine the lower envelope value (e.g., noise floor) over a series of audio frames but determine the upper envelope value based only on the instant loudness value of the current audio frame, such that the VAD 200 compares the instant loudness value to the noise floor to determine whether voice activity is detected in the current audio frame.

To illustrate a detailed example of performing voice activity detection, the VAD 200 may track the upper envelope value using a first single-pole filter with asymmetric attack (e.g., very fast) and release (e.g., very slow) speeds. Thus, the first single-pole filter will increase quickly when the instant loudness value is higher than the current upper envelope value, but release slowly when the instant loudness value is lower than the current upper envelope value, tracking the upper envelope of the audio waveform despite fluctuations in the instant loudness value over time. The first single-pole filter may switch to a faster release speed when the instant loudness value is consistently lower than the upper envelope value for a duration of time that exceeds a first time threshold value. Thus, when the upper envelope value is consistently higher than the instant loudness value, the first single-pole filter switches to the faster release speed to accurately track the upper envelope of the audio waveform.

Similarly, the VAD 200 may track the lower envelope value (e.g., noise floor) using a second single-pole filter with asymmetric attack (e.g., very slow) and release (e.g., very fast) speeds. Thus, the second single-pole filter will decrease quickly when the instant loudness value is lower than the current lower envelope value, but increase slowly when the instant loudness value is higher than the current lower envelope value, tracking the lower envelope of the audio waveform despite fluctuations in the instant loudness value over time. The second single-pole filter may switch to a faster attack speed when the instant loudness value is consistently higher than the lower envelope value for a duration of time that exceeds a second time threshold value. Thus, when the lower envelope value is consistently lower than the instant loudness value, the second single-pole filter switches to the faster attack speed to accurately track the lower envelope of the audio waveform. The second time threshold value may be equal to the first time threshold value, although the disclosure is not limited thereto and the time threshold values may vary without departing from the disclosure.

The second single-pole filter is able to track the level of stationary noise (e.g., white noise or tonal) over time, enabling the VAD 200 to determine that an audio frame does not include voice activity (e.g., VAD=0) even when the noise level is high. For example, the VAD 200 may determine that voice activity is detected (e.g., VAD=1) when the upper envelope value is greater than the lower envelope value by more than a threshold value. In some examples, the VAD 200 may only determine that voice activity is detected when the upper envelope value is greater than the lower envelope value by more than the threshold value and the signal level is higher than a minimum threshold value.

To improve the performance of the VAD 200, the device 110 may determine the loudness values (e.g., RMS values) using a logarithmic scale instead of a linear scale. Thus, the loudness values (e.g., instant loudness value, upper envelope value, lower envelope value, etc.) may be measured in decibels (dB). However, the disclosure is not limited thereto and the device 110 may determine the loudness values using any techniques known to one of skill in the art without departing from the disclosure.

In some examples, the VAD 200 may perform smoothing (e.g., hangover smoothing) when switching between VAD=0 and VAD=1 in order to fade the speech/noise boundaries. For example, the VAD 200 may perform smoothing for 10 audio frames when initially detecting voice activity (e.g., transitioning from VAD=0 to VAD=1). The VAD 200 may not perform smoothing when switching between VAD=1 and VAD=0, although the disclosure is not limited thereto.

Based on the VAD data generated by the VAD 200, the device 110 may classify an audio frame as corresponding to speech (e.g., voice activity is detected, represented as VAD=1) or non-speech (e.g., voice activity is not detected, represented as VAD=0) and process the audio frame accordingly. For ease of illustration, audio frames that are not associated with voice activity (e.g., VAD=0) may be described as representing non-speech, silence, and/or noise, whereas audio frames that are associated with voice activity (e.g., VAD=1) may be described as representing speech. However, the disclosure is not limited thereto. Depending on how the VAD 200 is implemented, the VAD data may classify a first audio frame that is below an energy threshold as non-speech, despite the first audio frame including a representation of speech, and/or may classify a second audio frame that is above the energy threshold as corresponding to speech, despite the second audio frame not including a representation of speech, without departing from the disclosure.

When the VAD 200 indicates that non-speech activity is detected (e.g., VAD=0), the device 110 may classify a current audio frame as a non-speech frame 210 and process the non-speech frame 210 accordingly. For example, FIG. 2 illustrates that the device 110 may update (212) a noise estimate, may determine (214) a silence gain value, and may apply (216) the silence gain value to generate output audio data. The noise estimate corresponds to a lower envelope of the input audio data (e.g., local minima) during an utterance and may be used to determine a signal-to-noise ratio (SNR) value. In some examples, the silence gain value may be a fixed value used for all non-speech audio frames. However, the disclosure is not limited thereto and in other examples the device 110 may determine the silence gain value using any techniques in the art without departing from the disclosure. For example, the device 110 may determine the silence gain value by reducing a previous gain value, such that the device 110 further reduces the silence gain value over time.

When the VAD 200 indicates that speech activity is detected (e.g., VAD=1), the device 110 may classify a current audio frame as a speech frame 220 and process the speech frame 220 accordingly. For example, FIG. 2 illustrates that the device 110 may update (222) a loudness estimate, may determine (224) an adaptive gain value, and may apply (226) the adaptive gain value to generate output audio data. The loudness estimate corresponds to an upper envelope of the input audio data (e.g., local maxima) during an utterance and may be used to determine the signal-to-noise ratio (SNR) value. As will be described in greater detail below, the device 110 may determine the adaptive gain value by comparing the loudness estimate to a target loudness value.

In some examples, the target gain value may be a fixed value used for all speech audio frames. For example, a fixed target gain value of 0 dB corresponds to performing volume leveling to normalize different audio waveforms (e.g., different utterances associated with one or more voices) to a consistent level. However, the disclosure is not limited thereto and in other examples the target gain value may vary based on the input level, such that the device 110 performs dynamic range expansion and/or dynamic range compression. For example, the device 110 may determine the target gain value based on an input level, a gain curve, a static gain chart, a volume index value (e.g., desired volume level input by the user 5), the SNR value, and/or other parameters without departing from the disclosure.

Figure 3:
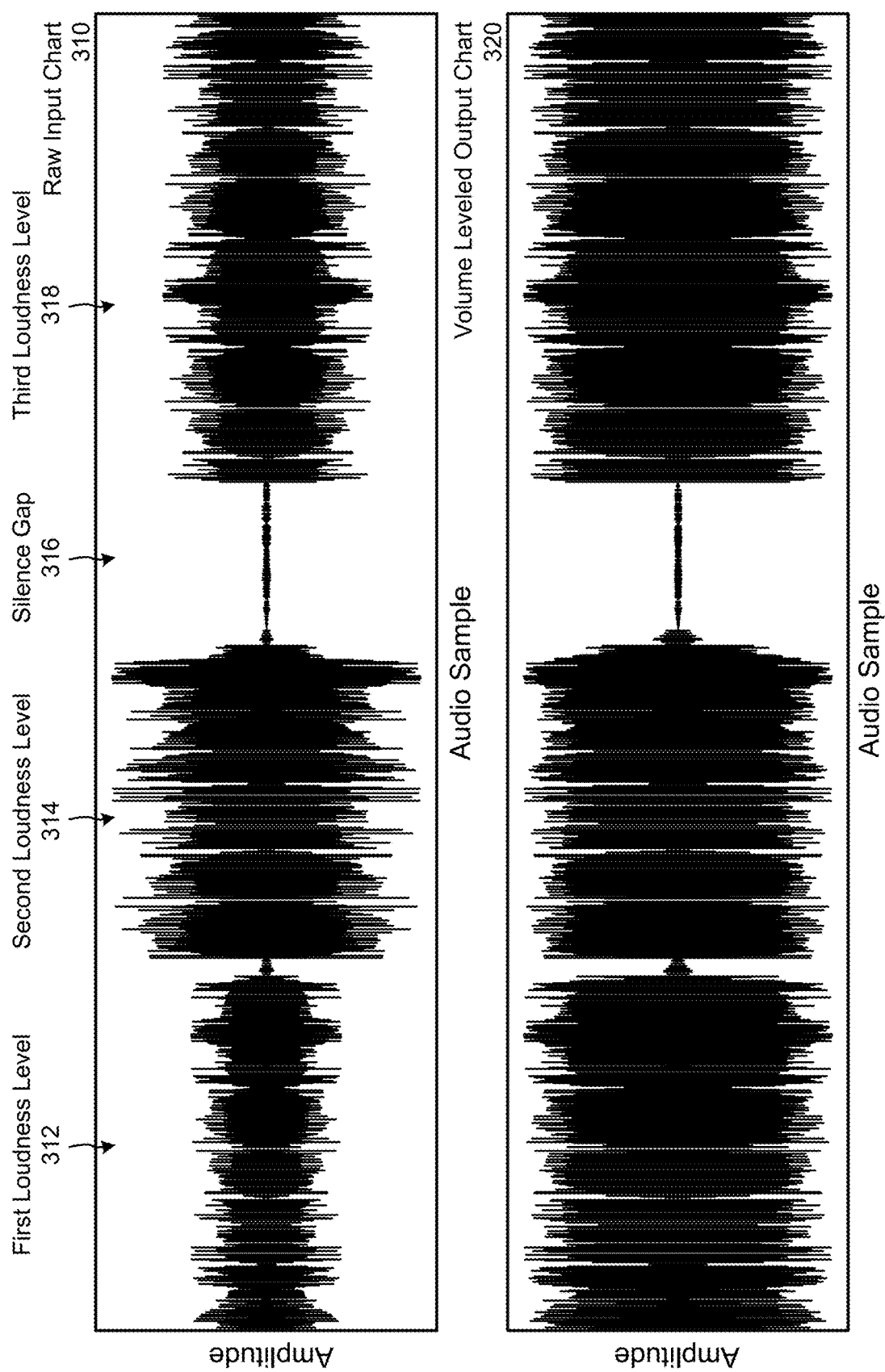
FIG. 3 illustrates an example of volume-leveled output data according to embodiments of the present disclosure.

FIG. 3 illustrates an example of volume-leveled output data according to embodiments of the present disclosure. As illustrated in FIG. 3, a raw input chart 310 illustrates an example of input audio data corresponding to different voices and a volume leveled output chart 320 illustrates an example of output audio data generated based on the input audio data. As represented in the raw input chart 310, the input audio data can be separated into four distinct portions that are associated with different input amplitudes (e.g., input energy levels); a first portion (e.g., first loudness level 312) associated with a first input amplitude, a second portion (e.g., second loudness level 314) associated with a second input amplitude that is higher than the first input amplitude, a third portion (e.g., silence gap 316) corresponding to a duration of non-speech activity, and a fourth portion (e.g., third loudness level 318) associated with a third input amplitude that is between the first input amplitude and the second input amplitude.

The device 110 may determine a target loudness value (e.g., using a gain curve, a volume index value, additional parameters and/or the like), may determine a plurality of loudness estimate values based on the input amplitudes, may determine a plurality of first gain values corresponding to the plurality of loudness estimate values, and may generate the output audio data using the plurality of gain values. The plurality of loudness estimate values may correspond to individual audio frames, a group of audio frames, and/or the like. Similarly, the plurality of gain values may correspond to individual audio frames, a group of audio frames, and/or the like. The plurality of loudness estimate values and/or the plurality of gain values may be smoothed over time to reduce an amount of distortion in the output audio data, although the disclosure is not limited thereto.

As illustrated in the volume leveled output chart 320, the output audio data has relatively consistent maximum output amplitudes. For example, the first portion, the second portion and the fourth portion correspond to a similar volume level in the output audio data. Thus, while an upper envelope of the raw input audio data includes rapid fluctuations, the upper envelope of the output audio data does not. Therefore, the automatic gain control has improved the audio level consistency, while maintaining local variations and without compressing a dynamic range of the output audio data.

Figure 4:
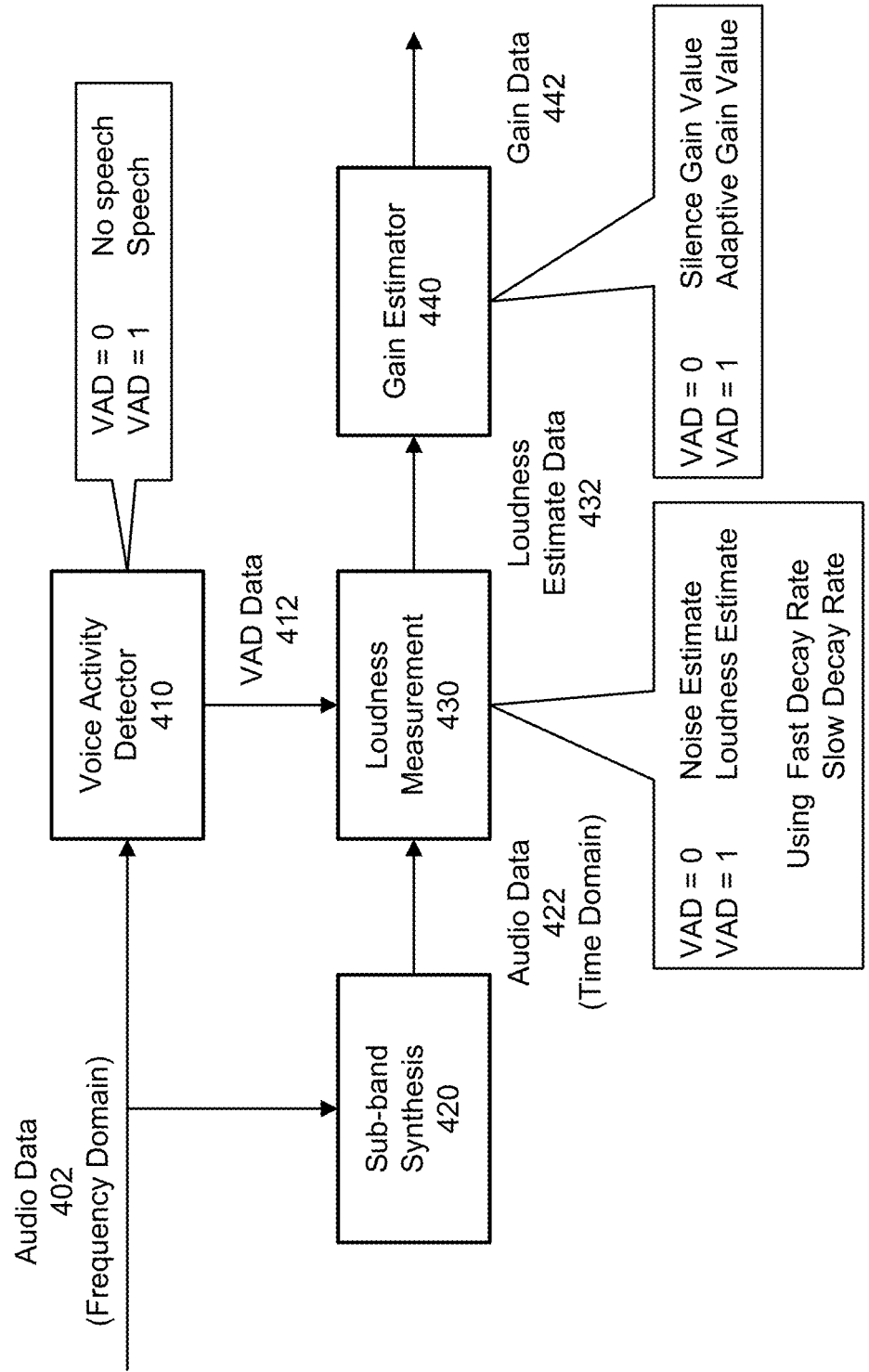
FIG. 4 illustrates an example component diagram for performing loudness measurement and gain estimation according to embodiments of the present disclosure.

FIG. 4 illustrates an example component diagram for performing loudness measurement and gain estimation according to embodiments of the present disclosure. As illustrated in FIG. 4, the device 110 may include a voice activity detector (VAD) 410, sub-band synthesis 420, loudness measurement 430, and gain estimator 440. Based on whether voice activity is detected by the VAD 410, the loudness measurement 430 tracks a noise estimate or a loudness estimate and the gain estimator 440 determines a silence gain value or an adaptive gain value corresponding to the loudness estimate.

The VAD 410 receives first audio data 402 in a frequency domain and performs voice activity detection to determine whether speech (e.g., voice activity) is present in the first audio data 402. For example, the VAD 410 may generate VAD data 412 by comparing an upper envelope value to a lower envelope value, as described above with regard to the VAD 200. However, the disclosure is not limited thereto and the VAD 410 may perform voice activity detection using any techniques known to one of skill in the art without departing from the disclosure. As illustrated in FIG. 4, the VAD data 412 indicates whether non-speech activity is detected (e.g., VAD=0) or whether speech activity is detected (e.g., VAD=1), and the VAD 410 may output the VAD data 412 to loudness measurement 430.

As illustrated in FIG. 4, the VAD 410 performs voice activity detection on the first audio data 402, which is in the frequency domain (e.g., sub-band domain). Therefore, the VAD 410 may detect voice activity using a portion of the first audio data 402, such as specific frequencies, frequency bands, and/or the like that improve voice activity detection. In some examples, the VAD 410 may detect voice activity using a specific frequency range that is associated with human speech (e.g., 1 kHz-5 kHz), although the disclosure is not limited thereto. For example, the device 110 may include a sub-band mask, a residual echo suppression (RES) component, a noise reduction (NR) component, and/or the like to reduce background noise and/or residual echoes prior to performing voice activity detection.

While FIG. 4 illustrates voice activity detection being performed on the first audio data 402 in the frequency domain, the device 110 may improve audio quality of the output audio data by performing loudness measurement and gain estimation in the time domain. Thus, FIG. 4 illustrates that the sub-band synthesis 420 may receive the first audio data 402 in the frequency domain and generate second audio data 422 in the time domain. Therefore, the loudness measurement 430 and the gain estimator 440 process the second audio data 422 in the time domain instead of the frequency domain, applying a single full-band gain value across all frequencies.

The loudness measurement 430 may determine a loudness estimate value corresponding to the input audio data and pass loudness estimate data 432 representing the loudness estimate value to the gain estimator 440. As illustrated in FIG. 4, the loudness measurement 430 may receive the second audio data 422 in the time domain and the VAD data 412 from the VAD 410. When the VAD data 412 indicates that voice activity is not detected, the loudness measurement 430 may update a noise estimate, whereas when the VAD data 412 indicates that voice activity is detected, the loudness measurement 430 may update the loudness estimate data 432.

As discussed above, the device 110 may determine the loudness values (e.g., RMS values) using a logarithmic scale instead of a linear scale. Thus, the loudness values (e.g., instant loudness value, loudness estimate, noise estimate, etc.) may be measured in decibels (dB), as this improves an accuracy of the loudness measurement 430 and makes it easier to tune parameters of the loudness measurement 430. However, the disclosure is not limited thereto and the device 110 may determine the loudness values using any techniques known to one of skill in the art without departing from the disclosure.

As discussed above, an instant loudness value corresponds to a single audio frame while the VAD 200 may track loudness values for a first duration of time (e.g., short term tracking) corresponding to several audio frames. In contrast, the loudness measurement 430 may track loudness values for a second duration of time (e.g., long term tracking) corresponding to a plurality of audio frames. For example, the upper envelope value determined by the VAD 200 may correspond to the instant loudness value (e.g., single audio frame), the lower envelope value (e.g., noise floor) determined by the VAD 200 may correspond to the first duration of time (e.g., measured in milliseconds), while the loudness estimate and the noise estimate determined by the loudness measurement 430 may correspond to the second duration of time (e.g., measured in seconds).

The loudness measurement 430 may function similarly to the VAD 200 described above with regard to FIG. 2. For example, the loudness measurement 430 may track the loudness estimate using a first leaky integrator (e.g., first single-pole filter) with asymmetric attack (e.g., fast) and release (e.g., very slow) speeds. Thus, the first leaky integrator will increase quickly when the instant loudness value is higher than the current loudness estimate value, but release slowly when the instant loudness value is lower than the current loudness estimate value, tracking an upper envelope of the audio waveform despite fluctuations in the instant loudness value over time. Thus, the first leaky integrator may maintain a consistent loudness estimate within voice activity (e.g., during a single utterance), avoiding rapid changes or other causes of distortion.

As used herein, the release speed may be referred to as a release time, a decay time, a decay rate, and/or the like without departing from the disclosure. Within voice activity (e.g., during an utterance), the device 110 may determine the loudness estimate using a slow decay rate to reduce variations and maintain a consistent loudness estimate over time. However, the device 110 may improve an audio quality of the output audio data by switching to a faster decay rate during certain conditions, such as between utterances (e.g., after a silence gap) or if the instant loudness value is consistently lower than the loudness estimate. This enables the first leaky integrator to quickly and accurately adapt to different voices (e.g., transition from a loud voice to a quiet voice) or to changing conditions (e.g., user gets quieter as the user walks away from the device 110).

In some examples, the loudness measurement 430 may switch to a faster decay rate after a silence gap. For example, the device 110 may determine that voice activity is not detected for a first duration of time that exceeds a first time threshold value and may use the faster decay rate for a period of time. After the period of time, or after voice activity is detected for a second duration of time that exceeds a second time threshold value, the loudness measurement 430 may switch to the normal, slow decay rate. This enables the device 110 to quickly adjust the loudness estimate at a beginning of an utterance (e.g., shift from a first level associated with a previous utterance to a second level associated with a current utterance), which reduces an amount of time that the gain estimate is too low. Thus, when transitioning from a loud voice to a quieter voice, the device 110 may maintain a consistent output volume in the output audio data, whereas the slow decay rate would result in a longer period of attenuation (e.g., voice would be quiet in the output audio data).

In other examples, the loudness measurement 430 may switch to a faster decay rate when the instant loudness value is lower than the loudness estimate consistently. For example, while voice activity is detected, the device 110 may determine that the instant loudness value is consistently lower than the loudness estimate for a second duration of time that exceeds a second time threshold value. Thus, when the loudness estimate is consistently higher than the instant loudness value, the loudness measurement 430 may switch to the faster decay rate to accurately track the loudness estimate. The loudness measurement 430 may switch to the faster decay rate for a fixed period of time or until the instant loudness value is no longer lower than the loudness estimate. After the fixed period of time or if the instant loudness value is higher than the loudness estimate, the loudness measurement 430 may switch to the normal, slow decay rate. For example, when a loud voice is followed by a quieter voice, the loudness measurement 430 may decrease the loudness estimate from a first range of loudness values (e.g., higher volume level) to a second range of loudness values (e.g., lower volume level) using the faster decay rate, then track the quieter voice using the slow decay rate.

In some examples, the loudness measurement 430 may accelerate the decay rate when the instant loudness value is consistently dropping. For example, instead of using a fixed decay rate, the device 110 may adaptively select the decay rate based on the duration of time that the instant loudness value is lower than the loudness estimate. Thus, the loudness estimate may decrease more rapidly the longer that the loudness estimate is higher than the instant loudness value.

When voice activity is not present (e.g., VAD=0), the loudness measurement 430 may track the noise estimate using a second leaky integrator with asymmetric attack (e.g., very slow) and release (e.g., very fast) speeds. Thus, the second leaky integrator will decrease quickly when the instant loudness value is lower than the current noise estimate value but increase slowly when the instant loudness value is higher than the current noise estimate value, tracking the noise estimate despite fluctuations in the instant loudness value over time. The second leaky integrator may switch to a faster attack speed when the instant loudness value is consistently higher than the noise estimate for a duration of time that exceeds a third time threshold value. Thus, when the noise estimate is consistently lower than the instant loudness value, the second leaky integrator switches to the faster attack speed to accurately track the noise estimate.

In some examples, the first time threshold value, the second time threshold value, and the third time threshold value may be identical. However, the disclosure is not limited thereto and the time thresholds may vary without departing from the disclosure.

Using the loudness estimate and the noise estimate, the device 110 may determine a signal-to-noise ratio (SNR) value associated with an audio frame. For example, the device 110 may determine the SNR value based on a difference between the loudness estimate and the noise estimate. In some examples, the device 110 may only update the loudness estimate when voice activity is detected (e.g., VAD=1) and the SNR value is above a threshold value, although the disclosure is not limited thereto.

The device 110 may determine one or more SNR values using different techniques. In some examples, the device 110 may determine SNR values corresponding to a short duration of time. For example, the device 110 may determine the difference between an instant loudness value and the noise estimate, which may correspond to a first duration of time measured in milliseconds. In other examples, the device 110 may determine SNR values corresponding to a longer duration of time. For example, the device 110 may determine the difference between a single loudness estimate and a single noise estimate, which may correspond to a second duration of time of approximately 1-3 seconds. Additionally or alternatively, the device 110 may determine SNR values corresponding to a very long duration of time. For example, the device 110 may determine the SNR values using a plurality of differences, which may correspond to a third duration of time of roughly 30 seconds. To illustrate an example, the device 110 may determine a first difference between a first loudness estimate and a first noise estimate and may apply a smoothing function to incorporate previous difference values determined within the third duration of time. Calculating the SNR values over the third duration of time avoids impulsive noises and other temporary fluctuations that may not correspond to speech. Therefore, in the implementation described above in which the SNR value is compared to a threshold value, the device 110 may calculate the SNR values using the third duration of time, although the disclosure is not limited thereto.

As discussed above, when voice activity is detected, the loudness measurement 430 may update the loudness estimate while freezing adaptation of the noise estimate. Thus, the instant loudness value is used to modify the loudness estimate but not the noise estimate. Meanwhile, if voice activity is not detected (e.g., non-speech activity is present), the loudness measurement 430 may update the noise estimate while freezing adaptation of the loudness estimate. Thus, the instant loudness value is used to modify the noise estimate but not the loudness estimate.

In some examples, the loudness measurement 430 may smooth the loudness estimate and/or the noise estimate over time. For example, the loudness measurement 430 may determine a smoothed loudness estimate using the following equation:

$$x^2\text{rms}(n) = (1-k) \cdot x^2\text{rms}(n-1) + k \cdot [x(n)]^2 \qquad [1]$$

where x(n) is the input audio data and factor k corresponds to an amount of smoothing or prior samples to include. For example, factor k may be a value between 0 and 1, with a value closer to zero corresponding to greater smoothing and a value of one corresponding to the current loudness estimate without any smoothing. In some examples, k=1−exp(−2.2/(fs*t/1000)), where t is a time constant in milliseconds (e.g., 50 ms) and fs is the sampling rate (e.g., 48 kHz), although the disclosure is not limited thereto.

If the loudness measurement 430 has not determined a previous loudness estimate value, the loudness measurement 430 may use an initial loudness estimate value. Once the loudness measurement 430 has determined a previous loudness estimate value, the loudness measurement 430 may update or "adapt" the loudness estimate value using Equation [1]. However, when the loudness measurement 430 determines that voice activity is not detected (e.g., noise/silence is detected), then adaptation of the loudness estimate value is frozen. For example, the loudness estimate for a non-speech audio frame would be determined using the following equation:

$$x^2\text{rms}(n) = x^2\text{rms}(n-1) \qquad [2]$$

While Equations [1]-[2] refer to determining the loudness estimate, the loudness measurement 430 may modify these equations to determine the noise estimate without departing from the disclosure.

In some examples, the device 110 may determine a loudness estimate for multi-channel audio data. For example, the loudness measurement 430 may determine an individual loudness estimate for each channel and may apply a weight value to the individual loudness estimates to generate an overall loudness estimate. For example, the weight value may correspond to a value of 0.5 for a stereo implementation or a value of 0.2 for a five channel implementation.

The gain estimator 440 may receive the VAD data 412 and the loudness estimate value and may generate gain data 442. For example, the gain data 442 may indicate an amount of gain to apply to the second audio data 422 to generate output audio data. As illustrated in FIG. 4, the gain estimator 440 may generate the gain data 442 differently depending on whether voice activity is detected in a current audio frame. For example, the gain estimator 440 may determine a silence gain value when voice activity is not detected (e.g., VAD=0) and may determine an adaptive gain value when voice activity is detected (e.g., VAD=1). As will be described in greater detail below, the gain estimator 440 may apply smoothing, ramping, interpolation, and/or other processing to smooth the gain data 442 and reduce distortion in the output audio data. For example, an instantaneous gain value is a specific value associated with an individual audio frame (e.g., whether an adaptive gain value or a silence gain value), and the gain estimator 440 may determine a smoothed gain value using several instantaneous gain values.

When voice activity is not detected, the gain estimator 440 may select a fixed gain value as the silence gain value. However, the disclosure is not limited thereto and in some examples the gain estimator 440 may determine the silence gain value for each audio frame without departing from the disclosure. For example, the gain estimator 440 may decrease a previous silence gain value to reduce the silence gain based on how many consecutive audio frames do not include voice activity.

When voice activity is detected, the gain estimator 440 may receive the loudness estimate value from the loudness measurement 430 and may determine an instantaneous gain value (e.g., adaptive gain value) based on the loudness estimate value. For example, the gain estimator 440 may compare the loudness estimate value to a fixed value (e.g., 0 dB) and determine the instantaneous gain value based on the difference. In some examples, the gain estimator 440 may receive a static gain curve associated with the audio data and may determine an instantaneous gain value based on the static gain curve and the loudness estimate value. For example, the gain estimator 440 may select the gain value along the static gain curve that corresponds to the loudness estimate value.

The gain estimator 440 may apply smoothing to the instantaneous gain value to generate a smoothed gain value. For example, the gain estimator 440 may determine the smoothed gain value using the equation shown below:

$$g(n) = \alpha * g(n-1) + (1-\alpha) * \text{gain} \quad [3]$$

where g(n) is the smoothed gain value, gain is the instantaneous gain value and the factor α is between 0.0 and 1.0.

Thus, the gain estimator 440 may incorporate previous gain values to reduce the variation of the adaptive gain, with an amount of previous gains determined based on the value chosen for the factor α. For example, α=0 corresponds to only using the instantaneous gain value, α=1 corresponds to using the previous gain value, and 0<α<1 corresponds to a variable amount of smoothing. As a result, the gain estimator ramps between different gain values to improve an audio quality of the output audio data.

Figure 5:
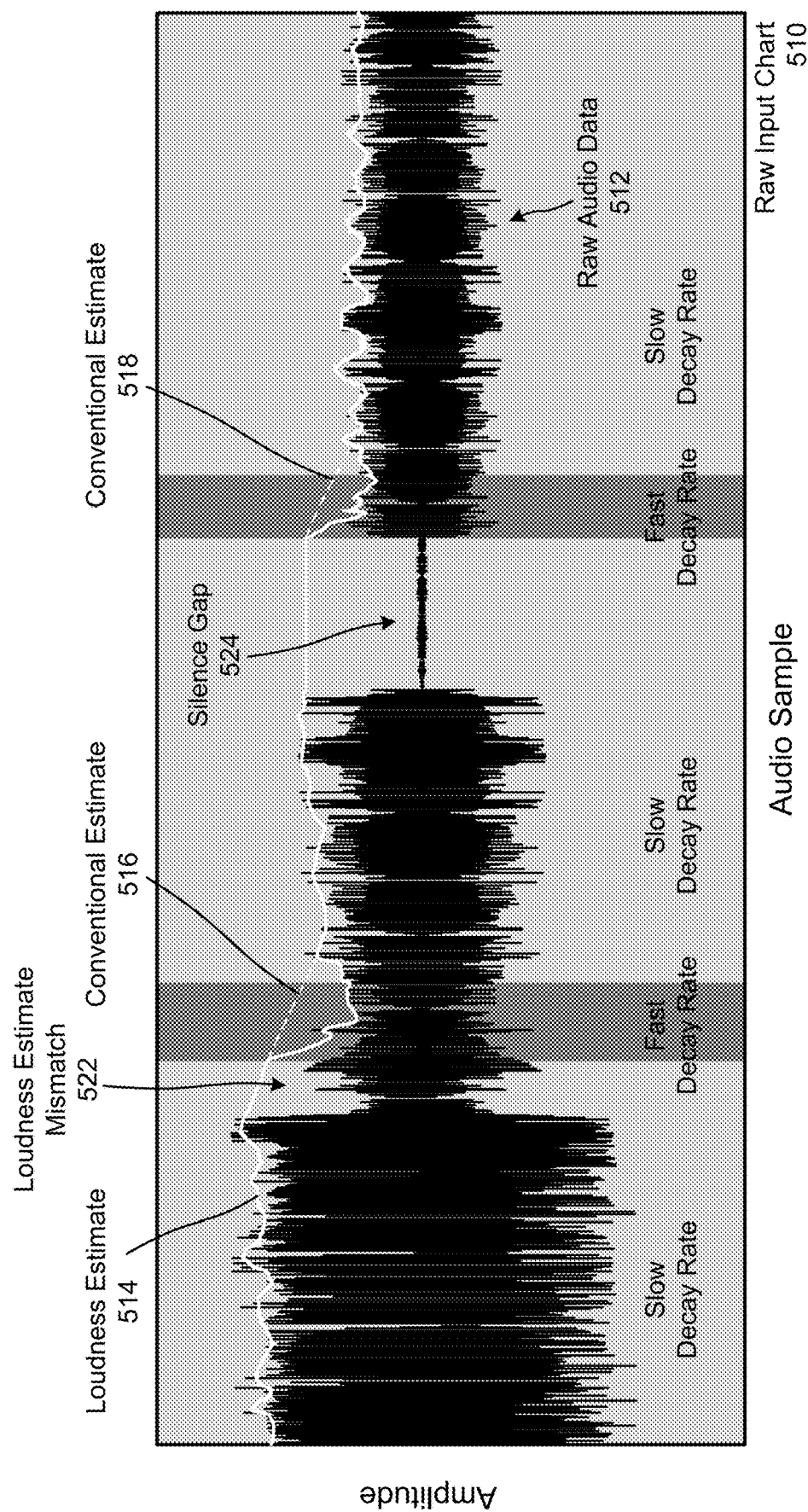
FIG. 5 illustrates an example of loudness estimates according to embodiments of the present disclosure.

FIG. 5 illustrates an example of loudness estimates according to embodiments of the present disclosure. As illustrated in FIG. 5, raw input chart 510 includes a representation of raw audio data 512 corresponding to different voices. As represented in the raw input chart 510, the raw audio data 512 can be separated into four distinct portions that are associated with different input amplitudes (e.g., input energy levels); a first portion associated with a first input amplitude, a second portion associated with a second input amplitude that is lower than the first input amplitude, a third portion corresponding to a duration of non-speech activity, and a fourth portion associated with a third input amplitude that is lower than the second input amplitude.

To conceptually illustrate an example of tracking the loudness estimate over time, the raw input chart 510 illustrates the raw audio data 512 as an audio waveform, with an upper and lower envelope of the audio waveform corresponding to an amplitude (e.g., energy level) of the raw audio data 512.

When voice activity is detected, the device 110 may track a loudness estimate 514, which is represented in FIG. 5 as roughly corresponding to the upper envelope of the raw audio data 512. During the first portion of the raw audio data 512, the device 110 tracks the loudness estimate 514 using a slow decay rate. However, as the first portion transitions to the second portion of the raw audio data 512, the device 110 determines that the instant loudness value is below the loudness estimate 514 for a duration of time (e.g., loudness estimate mismatch 522), and tracks the loudness estimate 514 using a fast decay rate. This increases a responsiveness of the loudness estimate to quickly transition to the second input amplitude of the second portion. Once the loudness estimate 514 reaches the instant loudness values of the raw audio data 512, the device 110 transitions to tracking the loudness estimate 514 using the slow decay rate again.

To illustrate the improved performance of the device 110 over conventional techniques, FIG. 5 illustrates a conventional estimate 516 that is determined using only the slow decay rate. As illustrated in FIG. 5, the conventional estimate 516 lags behind the loudness estimate 514 for a period of time, which would result in attenuated voices in the output audio data.

During the third portion of the raw audio data 512, the device 110 may determine that voice activity is not detected for a duration of time (e.g., silence gap 524) and switch to the fast decay rate. Thus, as the third portion transitions to the fourth portion of the raw audio data 512, the device 110 tracks the loudness estimate 514 using the fast decay rate. Again, this increases a responsiveness of the loudness estimate to quickly transition to the third input amplitude of the fourth portion. After detecting voice activity for a duration of time, the device 110 may transition to tracking the loudness estimate 514 using the slow decay rate again.

To illustrate the improved performance of the device 110 over conventional techniques, FIG. 5 illustrates a conventional estimate 518 that is determined using only the slow decay rate. As illustrated in FIG. 5, the conventional estimate 518 lags behind the loudness estimate 514 for a period of time after the silence gap 524, which would result in attenuated voices in the output audio data.

In some examples, the device 110 may determine the instant loudness values using a logarithmic scale (e.g., dB) and may track the loudness estimate and the noise estimate accordingly. For example, tracking these parameters using the logarithmic scale may improve performance, as the parameters may be easier to tune and more accurate. However, the disclosure is not limited thereto and the device 110 may track the parameters using any techniques known to one of skill in the art without departing from the disclosure.

Figure 6:
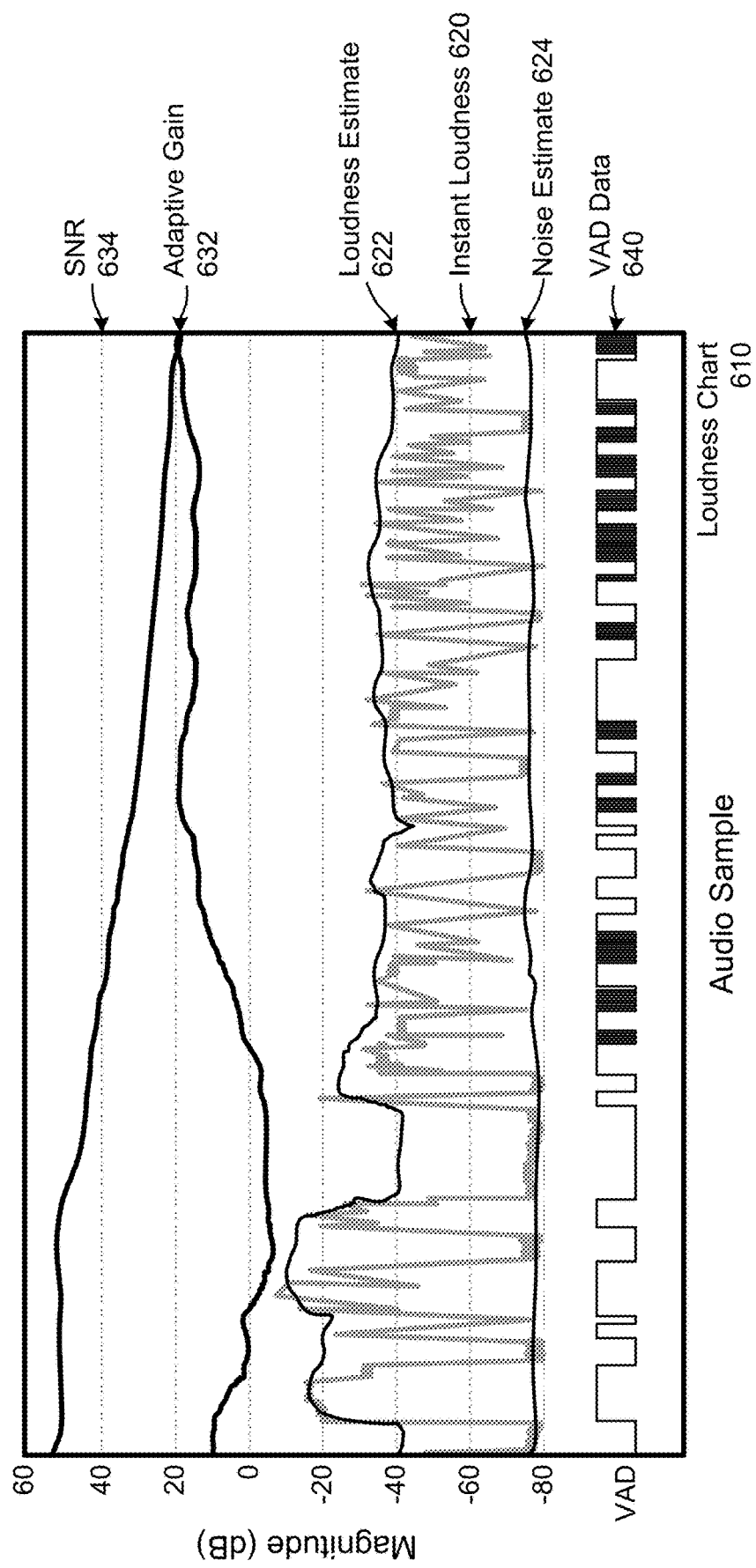
FIG. 6 illustrates an example of measurements used to determine an adaptive gain according to embodiments of the present disclosure.

FIG. 6 illustrates an example of measurements used to determine an adaptive gain according to embodiments of the present disclosure. As illustrated in FIG. 6, loudness chart 610 includes instant loudness values 620 that rapidly fluctuate over time, along with corresponding VAD data 640 indicating whether voice activity is detected in an audio frame. Based on the VAD data 640 and the instant loudness values 620, the device 110 may track a loudness estimate 622 (e.g., upper envelope of the instant loudness values 620) and a noise estimate 624 (e.g., lower envelope of the instant loudness values 620). As illustrated in FIG. 6, the loudness estimate 622 is responsive to the local maxima of the instant loudness values 620 and consistent over time, while the noise estimate 624 closely tracks the local minima of the instant loudness values 620.

Based on the loudness estimate 622, the device 110 may determine an adaptive gain 632. For example, the device 110 may compare the loudness estimate 622 to a desired target value (e.g., 0 dB) and determine the adaptive gain 632 based on the difference. In addition, the device 110 may determine signal-to-noise ratio (SNR) values 634 based on the loudness estimate 622 and the noise estimate 624. For example, the device 110 may determine the SNR values 634 based on a difference between the loudness estimate 622 and the noise estimate 624, although the disclosure is not limited thereto and the device 110 may determine the SNR values 634 using any technique known to one of skill in the art.

The device 110 may determine one or more SNR values using different techniques. In some examples, the device 110 may determine SNR values corresponding to a short duration of time. For example, the device 110 may determine the difference between an instant loudness value and the noise estimate, which may correspond to a first duration of time measured in milliseconds. In other examples, the device 110 may determine SNR values corresponding to a longer duration of time. For example, the device 110 may determine the difference between a single loudness estimate and a single noise estimate, which may correspond to a second duration of time of approximately 1-3 seconds. Additionally or alternatively, the device 110 may determine SNR values corresponding to a very long duration of time. For example, the device 110 may determine the SNR values using a plurality of differences, which may correspond to a third duration of time of roughly 30 seconds. To illustrate an example, the device 110 may determine a first difference between a first loudness estimate and a first noise estimate and may apply a smoothing function to incorporate previous difference values determined within the third duration of time. As calculating the SNR values over the third duration of time avoids impulsive noises and other temporary fluctuations that may not correspond to speech, the SNR values 634 illustrated in FIG. 6 correspond to the third duration of time.

Figure 7:
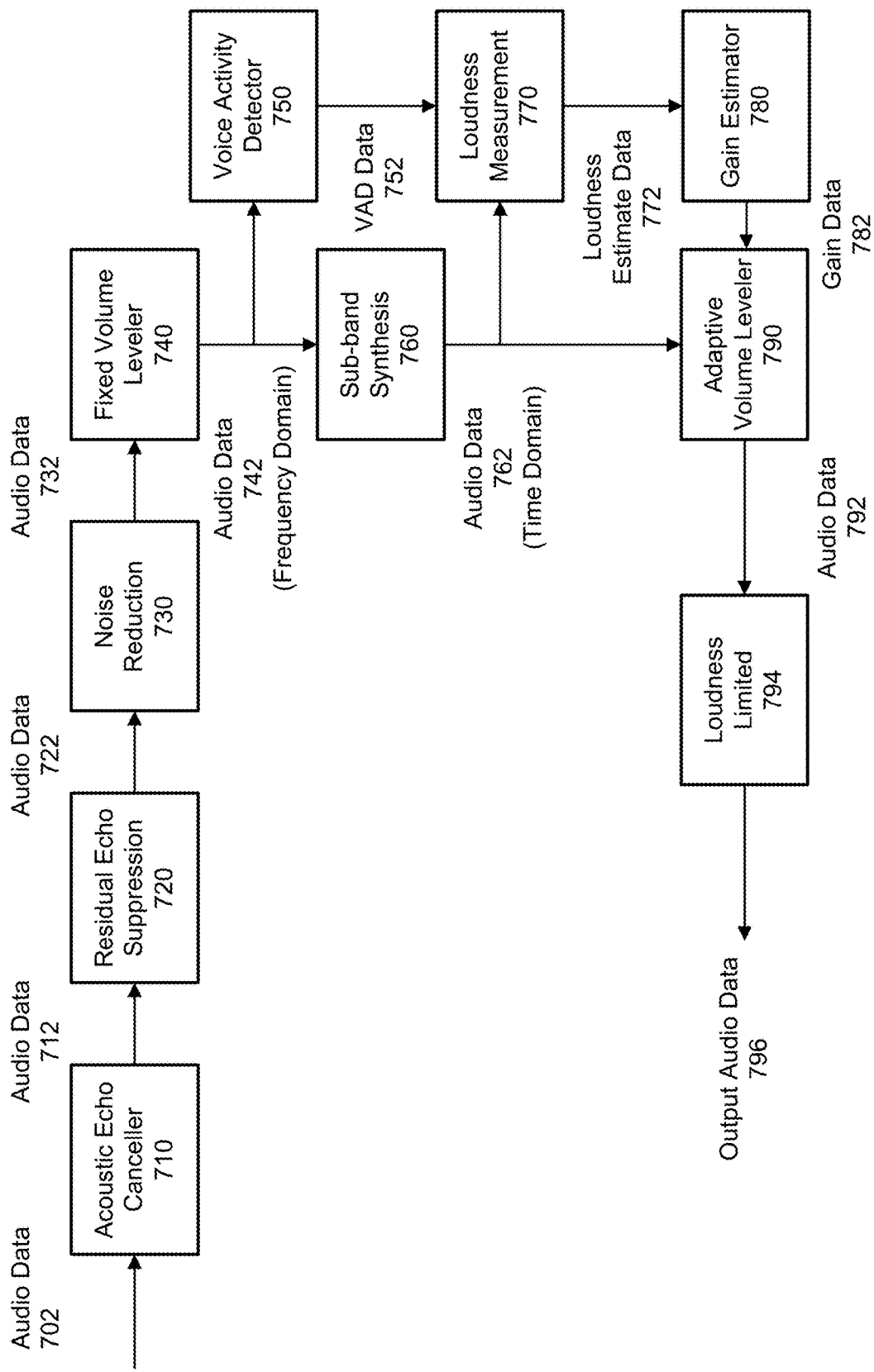
FIG. 7 illustrates an example component diagram for performing volume leveling according to embodiments of the present disclosure.

FIG. 7 illustrates an example component diagram for performing volume leveling according to embodiments of the present disclosure. As illustrated in FIG. 7, prior to performing voice activity detection the device 110 may process input audio data using an acoustic echo canceller 710, residual echo suppression 720, noise reduction 730, and a fixed volume leveler 740 using techniques known to one of skill in the art, although the disclosure is not limited thereto. For example, the acoustic echo canceller 710 may receive first audio data 702 and perform echo cancellation to generate second audio data 712, the residual echo suppression 720 may receive the second audio data 712 and perform echo suppression to generate third audio data 722, the noise reduction 730 may receive the third audio data 722 and perform noise reduction to generate fourth audio data 732, and the fixed volume leveler 740 may receive the fourth audio data 732 and perform volume leveling using a fixed amount of gain (e.g., apply a constant gain) to generate fifth audio data 742.

As illustrated in FIG. 7, the audio data prior to the sub-band synthesis 760 (e.g., first audio data 702, second audio data 712, third audio data 722, fourth audio data 732, and fifth audio data 742) is in the frequency domain. Thus, a voice activity detector 750 may receive the fifth audio data 742 in the frequency domain and perform voice activity detection to generate VAD data 752 based on a portion of the fifth audio data 742 that is associated with specific frequency range(s). The voice activity detector 750 may operate similarly to the voice activity detector 410 described in greater detail above with regard to FIG. 4.

The sub-band synthesis 760 may receive the fifth audio data 742 in the frequency domain and may generate sixth audio data 762 in a time domain. Loudness measurement 770 may receive the sixth audio data 762 and the VAD data 752 and may determine loudness estimate data 772, which may include a noise estimate and/or a loudness estimate. The gain estimator 780 may receive the loudness estimate data 772 and may generate gain data 782 corresponding to an amount of gain to apply to individual audio frames in the sixth audio data 762. As the sub-band synthesis 760, the loudness measurement 770, and the gain estimator 780 may operate similarly to the sub-band synthesis 420, the loudness measurement 430, and the gain estimator 440 described in greater detail above with regard to FIG. 4, a corresponding description is omitted.

An adaptive volume leveler 790 may receive the sixth audio data 762 and the gain data 782 and may generate seventh audio data 792. For example, the adaptive volume leveler 790 may determine an individual gain value associated with an input audio frame in the sixth audio data 762 and may generate an output audio frame in the seventh audio data 792 by applying the individual gain value to the input audio frame.

A loudness limiter 794 may receive the seventh audio data 792 and may generate output audio data 796. The loudness limiter 794 may be configured to prevent distortion and/or excessively loud output during a transition from a first loudness estimate (e.g., quiet voice) to a higher second loudness estimate (e.g., loud voice). For example, the first loudness estimate may correspond to a first voice at a distance from the device 110, such that the first loudness estimate is low and a corresponding adaptive gain is relatively high. When a second voice that is close to the device 110 talks, the high adaptive gain will be applied until the loudness estimate converges on the second loudness estimate, resulting in the seventh audio data 792 being extremely loud for a short period of time. To prevent these periods of excessive loudness, the loudness limiter 794 may track the loudness values over a shorter duration of time, without any look-ahead. For example, the loudness limiter 794 may determine short-term loudness estimate values and limit transient loudness based on the short-term loudness estimate values. In some examples, the loudness limiter 794 may include a compressor with a fast attack time and a fast release time, although the disclosure is not limited thereto and the loudness limiter 794 may perform attenuation using any technique known to one of skill in the art without departing from the disclosure.

While FIG. 7 illustrates the gain estimator 780 and/or the loudness limiter 794 as being separate from the adaptive volume leveler 790, the disclosure is not limited thereto and the adaptive volume leveler 790 may include the gain estimator 780 and/or the loudness limiter 794 without departing from the disclosure.

While not illustrated in FIG. 7, the adaptive volume leveler 790 may include a look-ahead buffer configured to receive the sixth audio data 762 and generate delayed audio data corresponding to the sixth audio data 762. For example, the look-ahead buffer may introduce a slight delay that allows the device 110 to generate predictive level control, such that the gain decreases before any loud noises or other large variations in volume.

As discussed above, the device 110 may determine the loudness values using a logarithmic scale instead of a linear scale. Thus, the loudness values (e.g., instant loudness value, loudness estimate, noise estimate, etc.) may be measured in decibels (dB), as this improves an accuracy of the loudness measurement. In some examples, the device 110 may also determine the adaptive gain values using the logarithmic scale. However, the disclosure is not limited thereto, and in some examples the device 110 may determine the adaptive gain values using the linear scale. For example, the device 110 may apply inter-frame gain ramping using a linear interpolation of gain values in the linear domain instead of the logarithmic domain to smoothly transition between gain values.

Figure 8A:
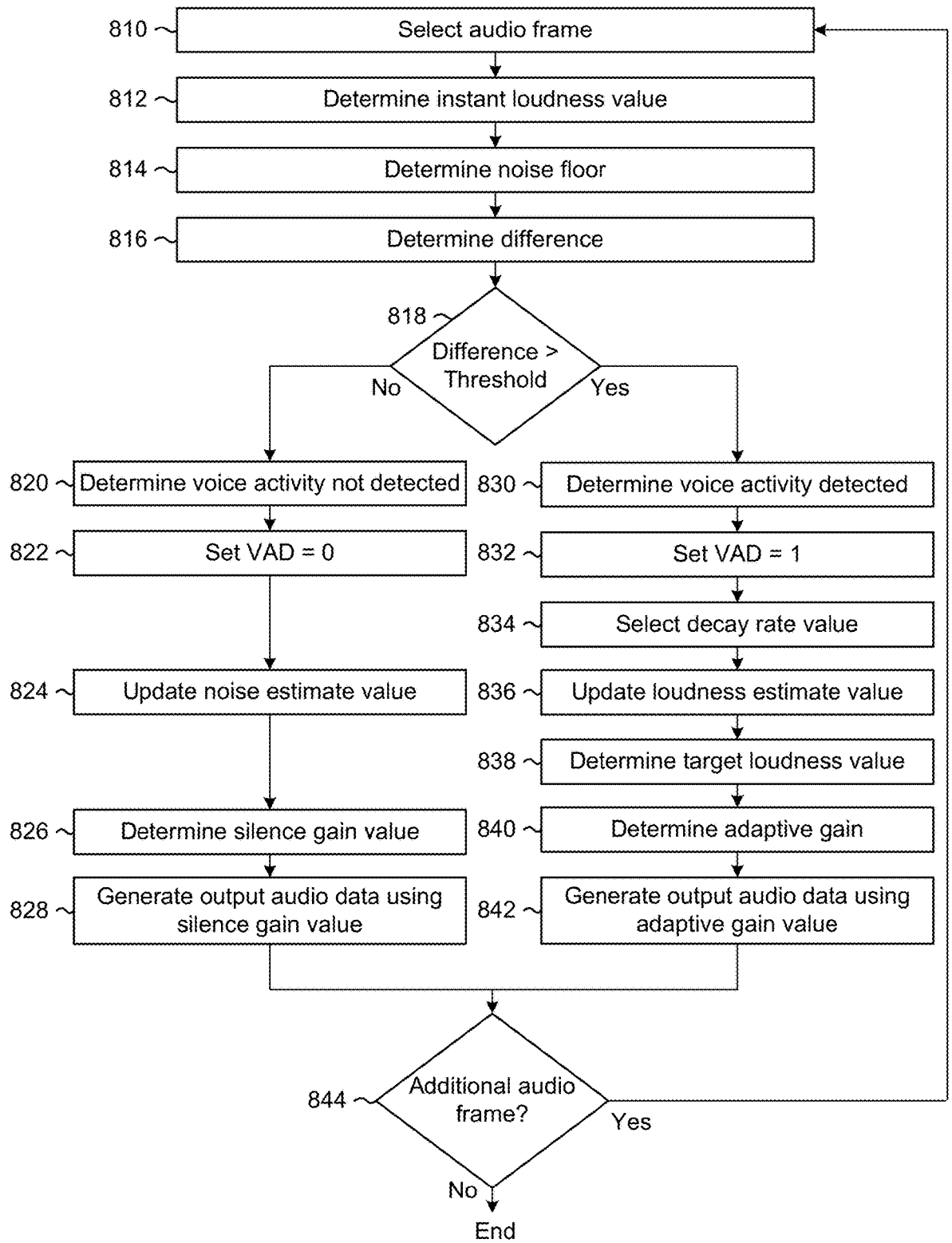
FIGS. 8A-8C are flowcharts conceptually illustrating example methods for generating volume-leveled output audio data according to embodiments of the present disclosure.

As described above, the device 110 may perform different actions based on whether a specific value satisfies a condition. For example, if a duration of a silence gap satisfies a condition, the device 110 may switch to a fast decay rate to improve a responsiveness of the loudness estimate tracking. For ease of illustration, the following flowcharts may illustrate examples of a specific value satisfying the condition using a threshold value. For example, FIG. 8A illustrates that the device 110 may perform voice activity detection by determining a difference between a loudness value and a noise floor and determining whether the difference is above (e.g., voice activity detected) or below (e.g., voice activity not detected) a threshold value. However, this is intended for illustrative purposes only and the disclosure is not limited thereto. As known to one of skill in the art, any step illustrated herein as comparing a specific value to a threshold value or any other reference value also corresponds to determining whether the specific value satisfies a condition, which can correspond to being above a threshold value, being below a threshold value, being within a certain range, and/or the like.

Figure 8B:
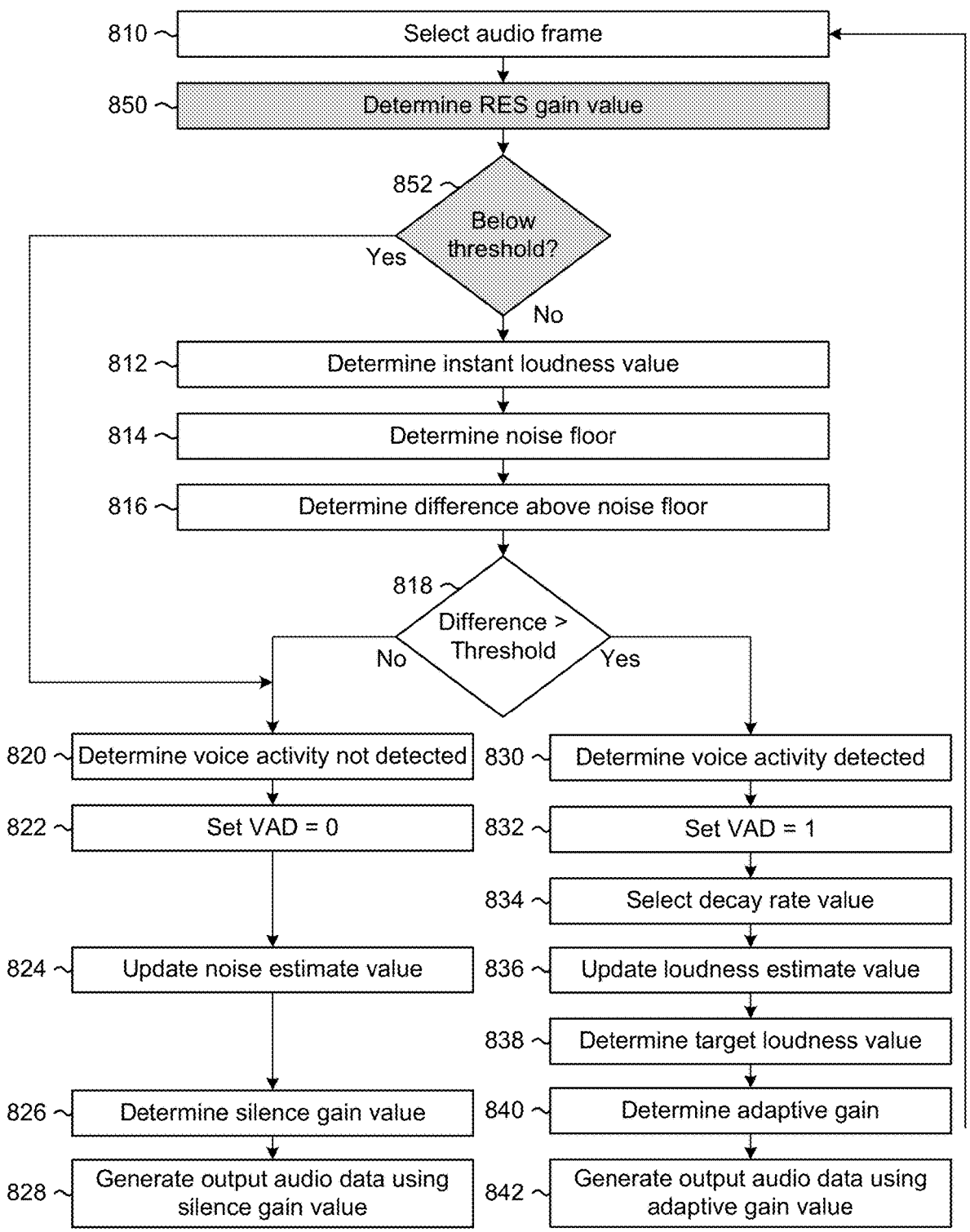
Figure 8C:
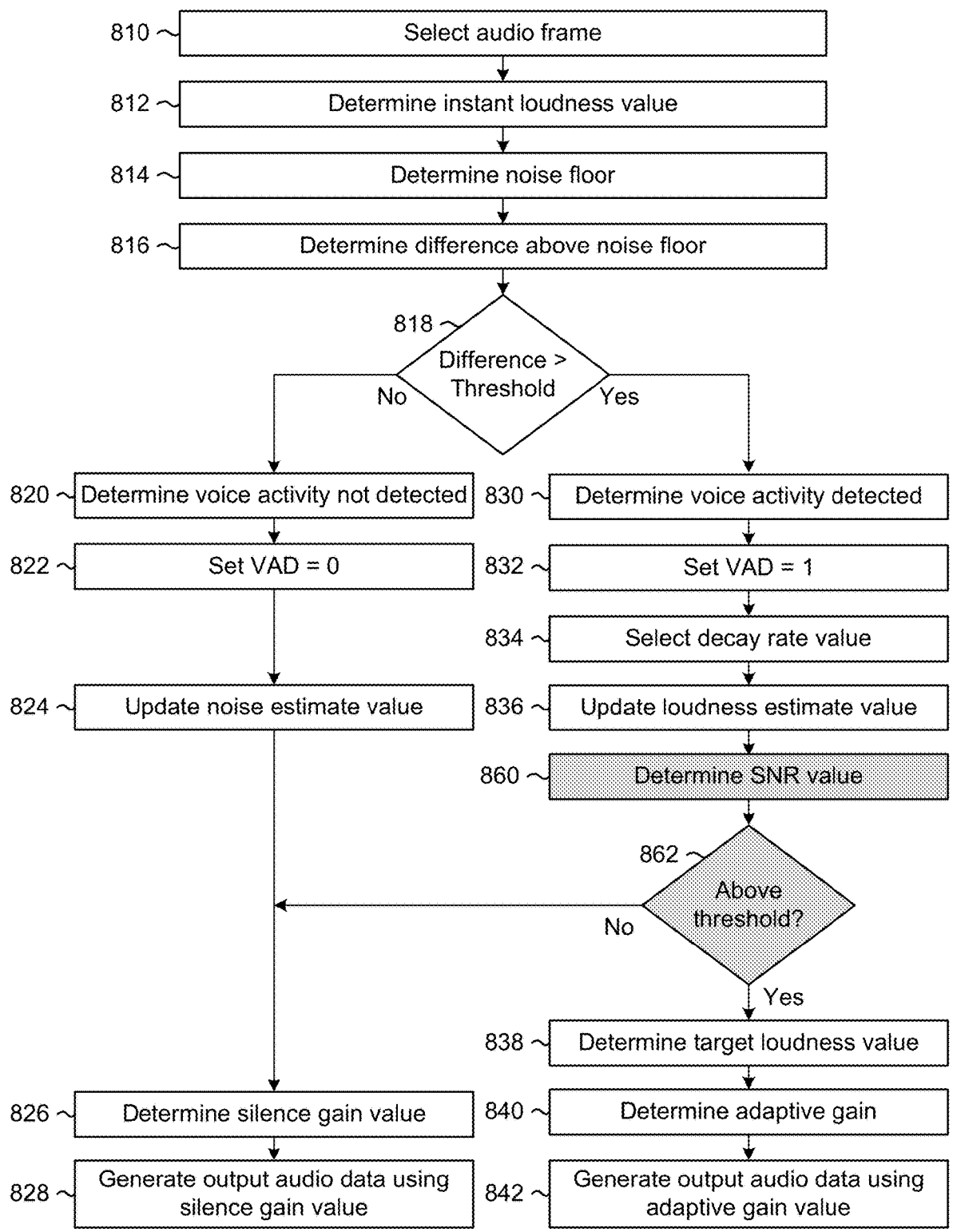

FIGS. 8A-8C are flowcharts conceptually illustrating example methods for generating volume-leveled output audio data according to embodiments of the present disclosure. As illustrated in FIG. 8A, the device 110 may select (810) an audio frame, determine (812) an instant loudness value associated with the audio frame, determine (814) a noise floor based on the instant loudness value, determine (816) a difference between the instant loudness value and the noise floor, and determine (818) whether the difference is above a threshold value. The device 110 may perform voice activity detection (VAD) based on the difference. For example, the device 110 may determine that voice activity is not detected if the difference is below the threshold value, whereas the device 110 may determine that voice activity is detected if the difference is above the threshold value.

As illustrated in FIG. 8A, if the difference is below the threshold value, the device 110 may determine (820) that voice activity is not detected, may set (822) a portion of VAD data to a first value of zero (e.g., VAD=0), may update (824) a noise estimate value, may determine (826) a silence gain value, and may generate (828) output audio data using the silence gain value.

If the device 110 determines that the difference is above the threshold value in step 818, the device 110 may determine (830) that voice activity is detected, may set (832) the portion of the VAD data to a second value of one (e.g., VAD=1), may select (834) a decay rate value (e.g., slow decay rate or fast decay rate), may update (836) a loudness estimate value, may determine (838) a target loudness value, may determine (840) an adaptive gain value, and may generate (842) the output audio data using the adaptive gain value.

The device 110 may then determine (844) whether there is an additional audio frame, and if so, may loop to step 810 and repeat steps 810-844 for the next audio frame.

In some examples, the device 110 may determine that voice activity is not detected based on a gain value applied during residual echo suppression (RES). For example, if the average RES gain value is below a threshold value, the device 110 may automatically determine that voice activity is not detected and set the portion of the VAD data to the first value of zero. As illustrated in FIG. 8B, the device 110 may select (810) an audio frame, may determine (850) a RES gain value associated with the selected audio frame, and may determine (852) whether the RES gain value is below a threshold value. If the RES gain value is below the threshold value, the device 110 may loop to step 820 and continue as described above with regard to FIG. 8A. If the RES gain value is above the threshold value, the device 110 may continue to step 812 as described above.

In some examples, the device 110 may determine that voice activity is not detected based on a signal-to-noise ratio (SNR) value being below a threshold value. As illustrated in FIG. 8C, after the device 110 updates the loudness estimate value in step 836, the device 110 may determine (860) a SNR value based on the loudness estimate value and the noise estimate value and may determine (862) whether the SNR value is above a threshold value. As described in greater detail above, the device 110 may determine the SNR value based on differences between the loudness estimate and the noise estimate over a long duration of time (e.g., 30 seconds), which smooths the SNR values and ignores impulsive noises and other temporary fluctuations that may not correspond to speech. If the SNR value is below the threshold value, the device 110 may loop to step 826 and continue as described above with regard to FIG. 8A. If the SNR value is above the threshold value, the device 110 may continue to step 838 as described above.

Figure 9:
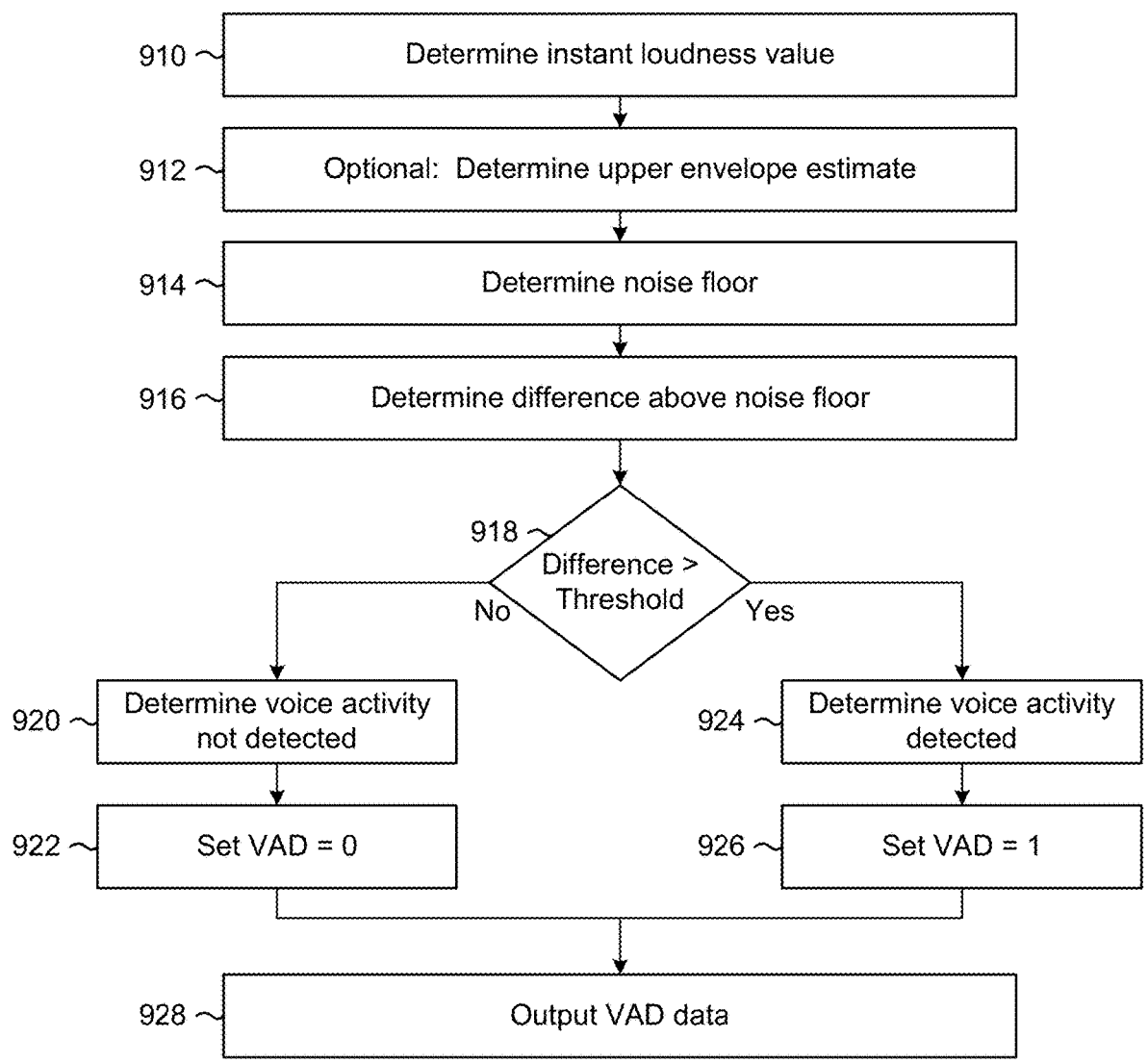
FIG. 9 is a flowchart conceptually illustrating an example method for generating voice activity detection data according to embodiments of the present disclosure.

FIG. 9 is a flowchart conceptually illustrating an example method for generating voice activity detection data according to embodiments of the present disclosure. As illustrated in FIG. 9, the device 110 may determine (910) an instant loudness value, may optionally determine (912) an upper envelope estimate using the instant loudness value, may determine (914) a noise floor using the instant loudness value, and may determine (916) a difference above the noise floor of the instant loudness value and/or the upper envelope estimate. For example, when the device 110 determines the upper envelope estimate in step 912, the device 110 may determine the difference between the upper envelope estimate and the noise floor in step 916. However, if the device 110 does not determine the upper envelope estimate in step 912, the device 110 may determine the difference between the instant loudness value and the noise floor in step 916.

The device 110 may determine (918) whether the difference is above a threshold value. If the difference is below the threshold value, the device 110 may determine (920) that voice activity is not detected and may set (922) a portion of VAD data to a first value of zero (e.g., VAD=0). If the difference is above the threshold value, the device 110 may determine (924) that voice activity is detected and may set (926) the portion of VAD data to a second value of one (e.g., VAD=1). Finally, the device 110 may output (928) the VAD data to another component of the device 110, to a remote device 110, and/or the like.

Figure 10:
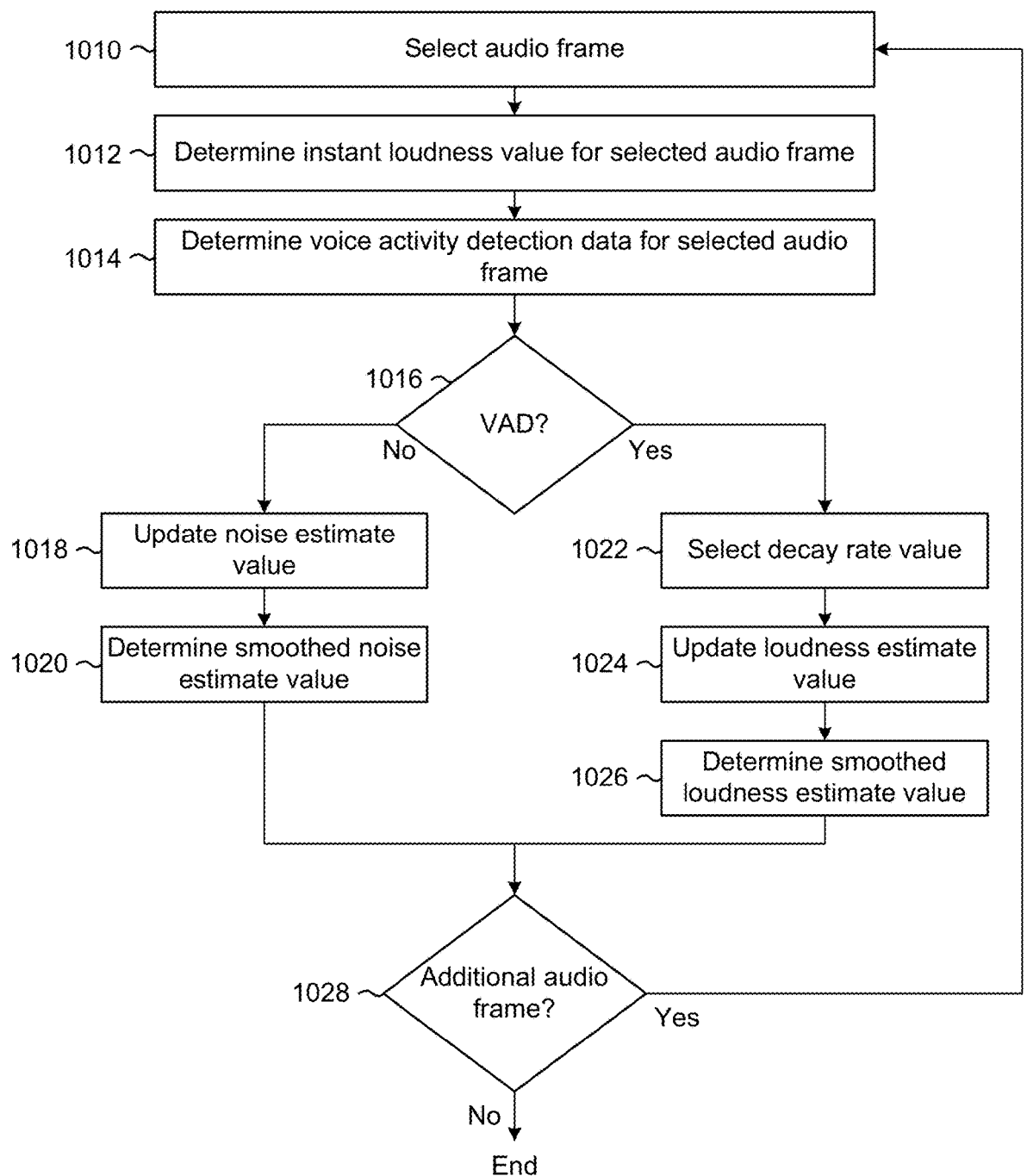
FIG. 10 is a flowchart conceptually illustrating an example method for determining loudness estimates and noise estimates according to embodiments of the present disclosure.

FIG. 10 is a flowchart conceptually illustrating an example method for determining loudness estimates and noise estimates according to embodiments of the present disclosure. As illustrated in FIG. 10, the device 110 may select (1010) an audio frame, determine (1012) an instant loudness value associated with the audio frame, determine (1014) voice activity detection (VAD) data for the selected audio frame, and determine (1016) whether the VAD data indicates that voice activity is detected in the selected audio frame.

As illustrated in FIG. 10, if voice activity is not detected, the device 110 may update (1018) a noise estimate value using the instant loudness value and may determine (1020) a smoothed noise estimate value based on the noise estimate value. If voice activity is detected, the device 110 may select (1022) a decay rate value (e.g., slow decay rate or fast decay rate), may update (1024) a loudness estimate value using the selected decay rate value and the instant loudness value, and may determine (1026) a smoothed loudness estimate value based on the loudness estimate value.

The device 110 may then determine (1028) whether there is an additional audio frame, and if so, may loop to step 1010 and repeat steps 1010-1028 for the next audio frame.

Figure 11A:
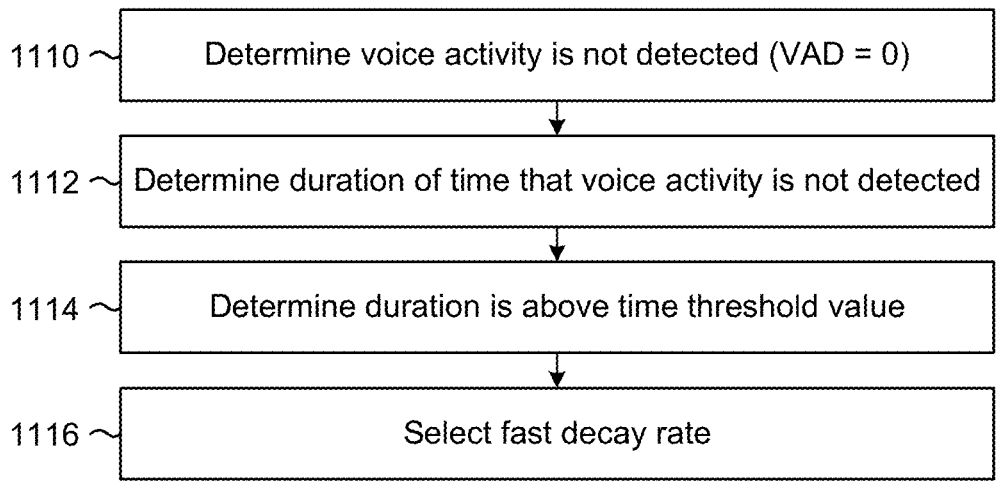
FIGS. 11A-11E are flowcharts conceptually illustrating example methods for selecting a decay rate for loudness estimation according to embodiments of the present disclosure.

FIGS. 11A-11E are flowcharts conceptually illustrating example methods for selecting a decay rate for loudness estimation according to embodiments of the present disclosure. FIG. 11A illustrates an example method for selecting a fast decay rate after a silence gap in which no voice activity is detected. As illustrated in FIG. 11A, the device 110 may determine (1110) that voice activity is not detected (e.g., VAD=0), may determine (1112) a duration of time that voice activity is not detected, may determine (1114) that the duration of time is above a time threshold value, and may select (1116) a fast decay rate value.

Figure 11B:
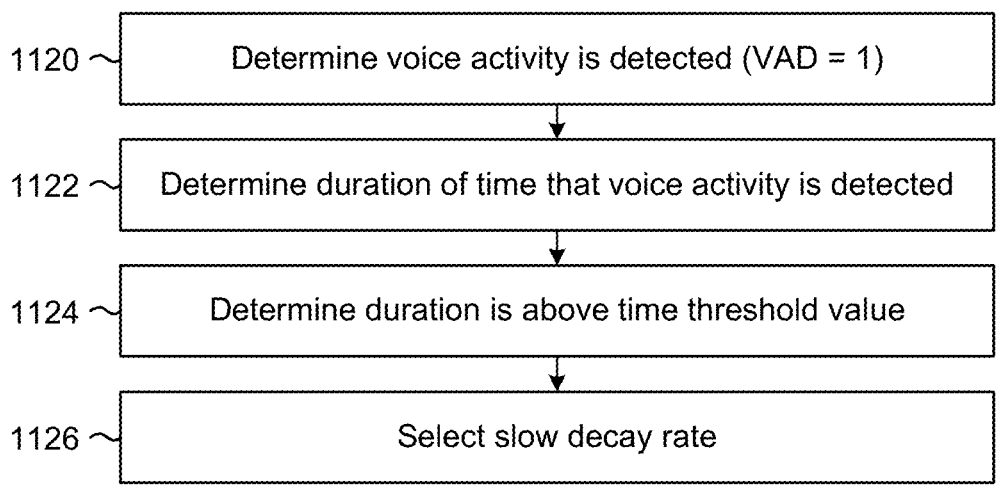

FIG. 11B illustrates an example method for selecting a slow decay rate while voice activity is consistently detected (e.g., within an utterance). As illustrated in FIG. 11B, the device 110 may determine (1120) that voice activity is detected (e.g., VAD=1), may determine (1122) a duration of time that the voice activity is detected, may determine (1124) that the duration of time is above a time threshold value, and may select (1126) a slow decay rate value.

Figure 11C:
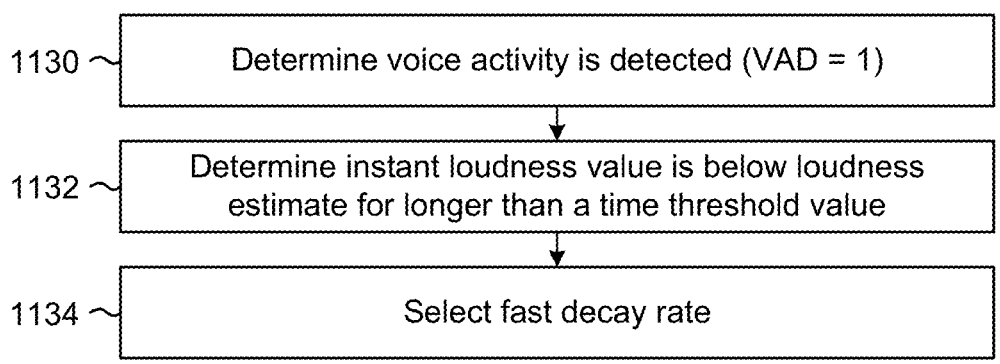

FIG. 11C illustrates an example simplified method for selecting a fast decay rate when there is a mismatch between the instant loudness value and the loudness estimate. As illustrated in FIG. 11C, the device 110 may determine (1130) that voice activity is detected (e.g., VAD=1), may determine (1132) that an instant loudness value is below a loudness estimate for longer than a time threshold value, and may select (1134) a fast decay rate value.

Figure 11D:
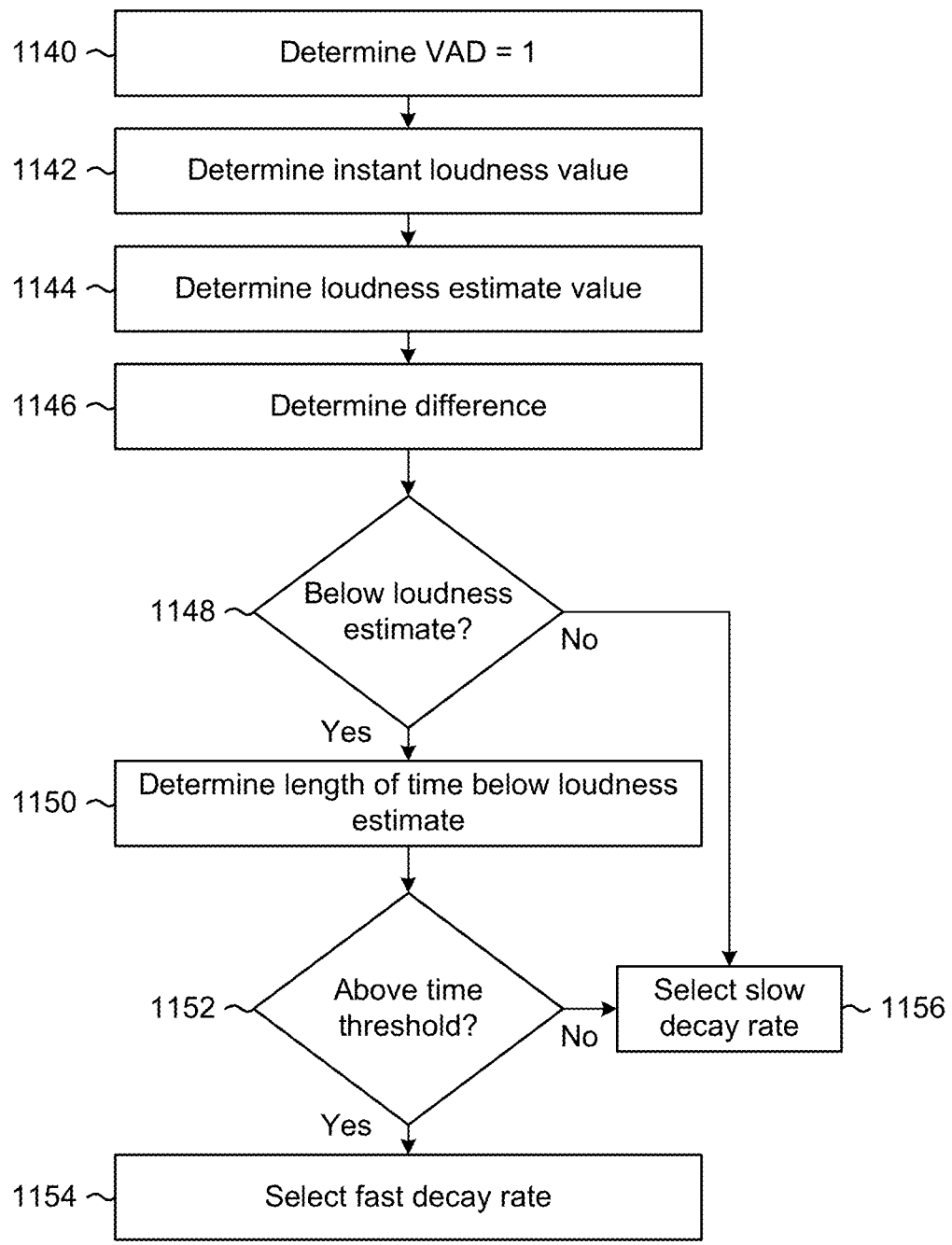

FIG. 11D illustrates a detailed example method for selecting a fast decay rate when there is a mismatch between the instant loudness value and the loudness estimate. As illustrated in FIG. 11D, the device 110 may determine (1140) that voice activity is detected (e.g., VAD=1), may determine (1142) an instant loudness value, may determine (1144) a loudness estimate value, and may determine (1146) a difference between the instant loudness value and the loudness estimate. The device 110 may determine whether the instant loudness value is below the loudness estimate, and if not, may loop to step 1156 and select a slow decay rate value. If the device 110 determines that the instant loudness value is below the loudness estimate, the device 110 may determine (1150) a length of time that the instant loudness value has been below the loudness estimate and determine (1152) whether this length of time is above a time threshold. If it is above the time threshold, the device 110 may select (1154) a fast decay rate value. If the length of time is below the time threshold, the device 110 may select (1156) a slow decay rate value.

Figure 11E:
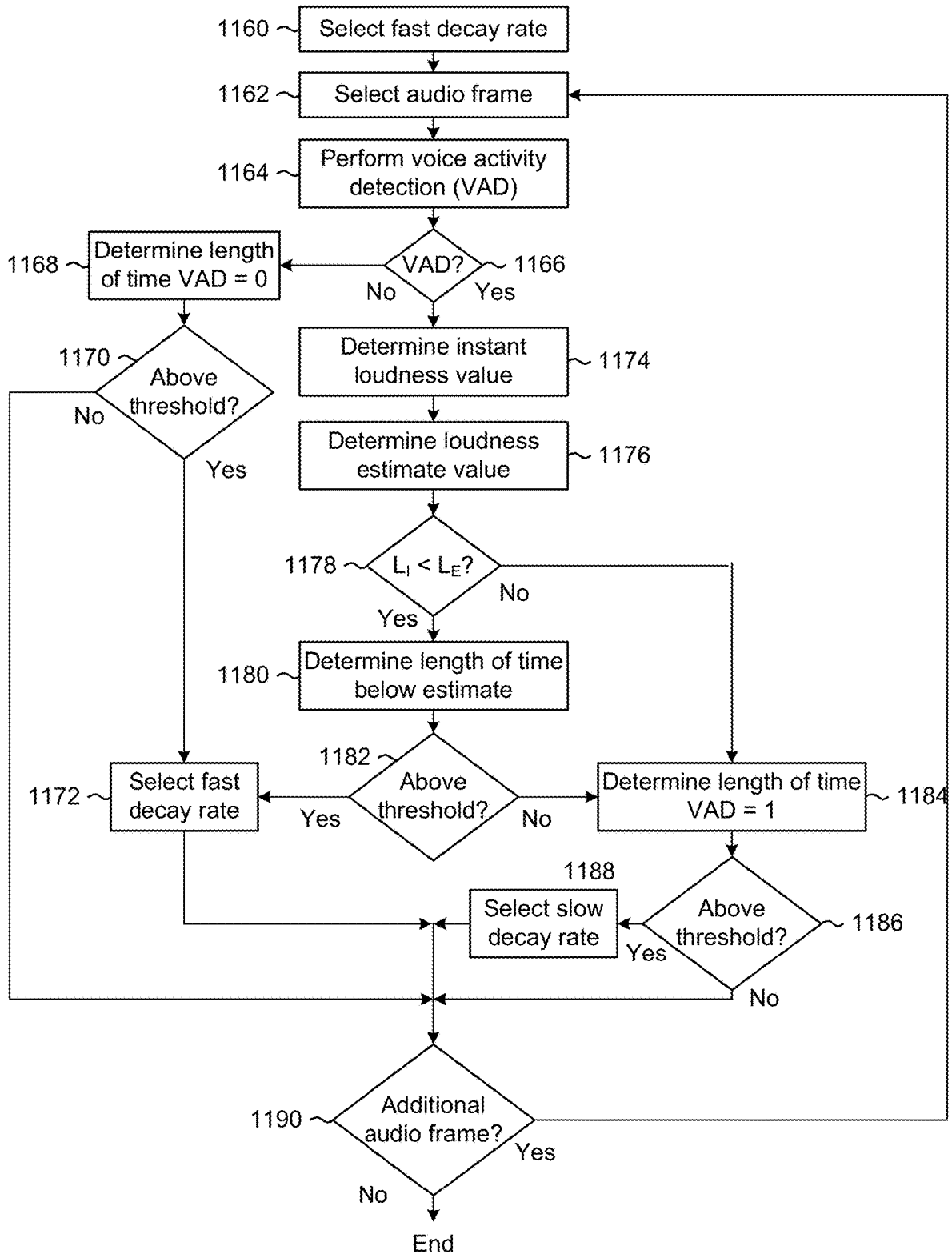

FIG. 11E illustrates a detailed example method for selecting a decay rate. As illustrated in FIG. 11E, the device 110 may select (1160) a fast decay rate value and select (1162) an audio frame. The device 110 may perform (1164) voice activity detection (VAD) and determine (1166) whether voice activity is detected. If voice activity is not detected, the device 110 may determine (1168) a length of time that voice activity has not been detected and determine (1170) whether this length of time is above a time threshold. If the length of time is above the time threshold, the device 110 may select (1172) a fast decay rate value and loop to step 1190. If the length of time is below the time threshold, the device 110 may loop to step 1190 without changing the decay rate.

If the device 110 detects voice activity in step 1166, the device 110 may determine (1174) an instant loudness value, determine (1176) a loudness estimate value, and determine (1178) whether the instant loudness value is below the loudness estimate value. If the instant loudness value is below the loudness estimate value, the device 110 may determine (1180) a length of time that the instant loudness values have been below the loudness estimate values and may determine (1182) whether the length of time is above a time threshold. If the length of time is above the time threshold, the device 110 may loop to step 1172 and select the fast decay rate. If the length of time is below the time threshold, or if the device 110 determined that the instant loudness value is not below the loudness estimate value in step 1178, the device 110 may determine (1184) a length of time that voice activity has been detected and determine (1186) whether this length of time is above a time threshold. If it is above the time threshold, the device 110 may select (1188) a slow decay rate value and loop to step 1190. If the length of time is not above the time threshold in step 1186, the device 110 may determine (1190) whether there is an additional audio frame and if so, may loop to step 1162 and repeat steps 1162-1190 for the additional audio frame.

Figure 12A:
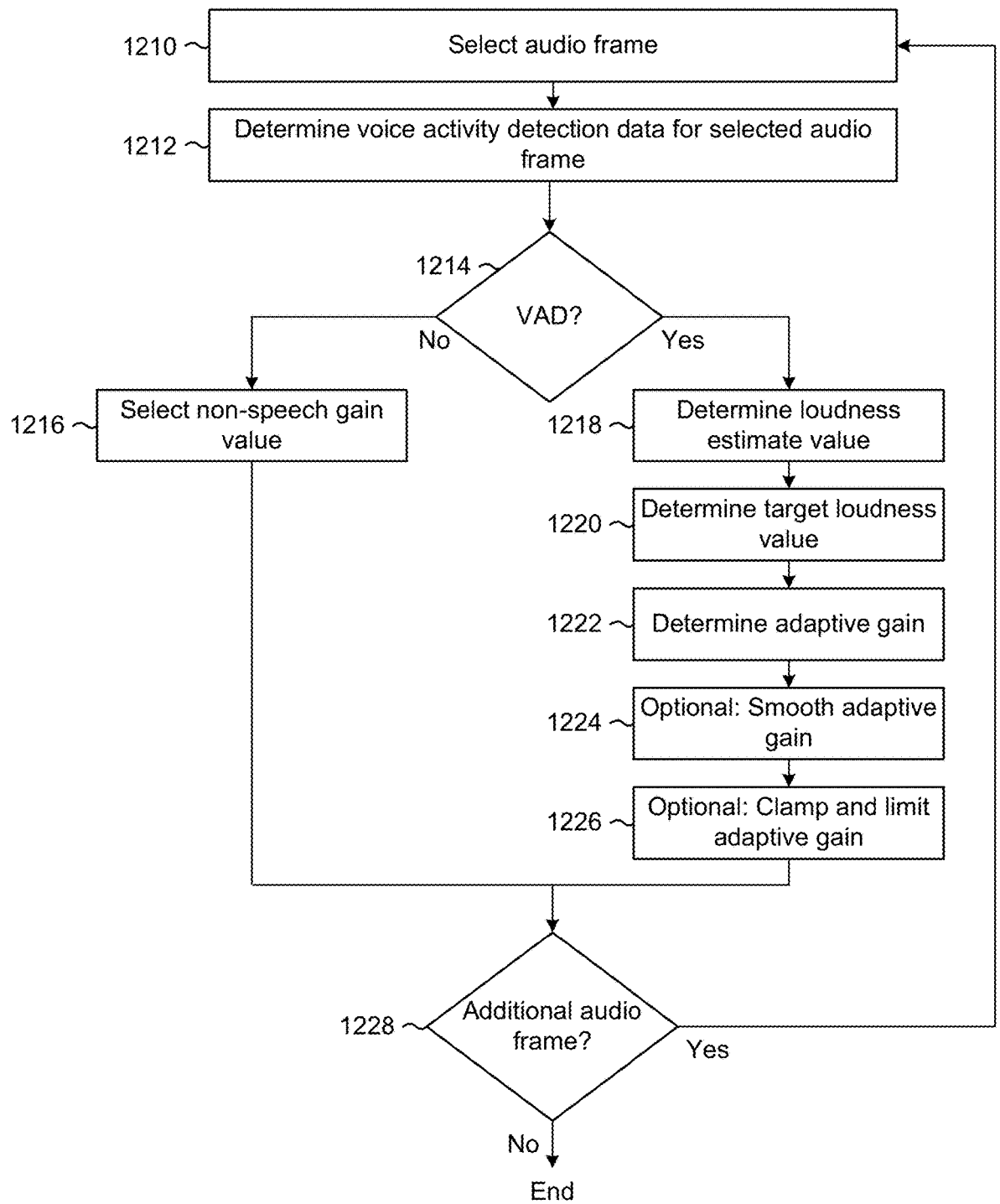
FIGS. 12A-12B are flowcharts conceptually illustrating example methods for determining a gain value according to embodiments of the present disclosure.
Figure 12B:
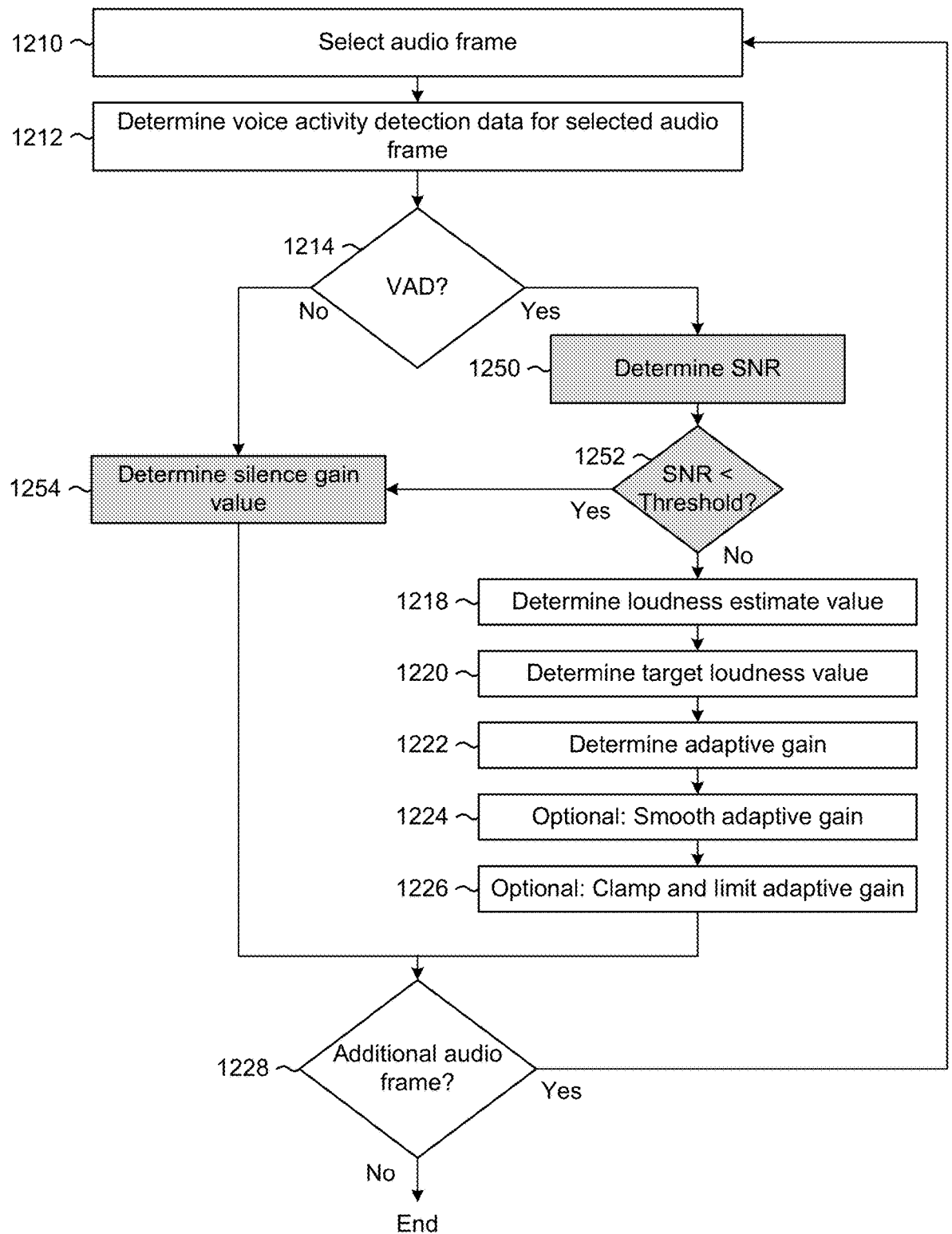

FIGS. 12A-12B are flowcharts conceptually illustrating example methods for determining a gain value according to embodiments of the present disclosure. As illustrated in FIG. 12A, the device 110 may select (1210) an audio frame, determine (1212) voice activity detection data for the selected audio frame, and determine (1214) whether voice activity is detected. If voice activity is not detected in step 1214, the device 110 may select (1216) a non-speech gain value and loop to 1228. For example, the non-speech gain value may be a fixed gain value used for silence or noise, such as 0 dB or any other fixed constant.

If voice activity is detected in step 1214, the device 110 may determine (1218) a loudness estimate value, may determine (1220) a target loudness value, may determine (1222) an adaptive gain corresponding to the loudness estimate value and the target loudness value, may optionally (1224) smooth the adaptive gain over time, and may optionally (1226) clamp and limit the adaptive gain to avoid excessively loud output or distortion. The device 110 may then determine (1228) whether there is an additional audio frame and, if so, may loop to step 1210 and repeat steps 1210-1228 for the additional audio frame.

While FIG. 12A illustrates the device 110 selecting a fixed gain value when voice activity is not detected in step 1214, the disclosure is not limited thereto. In some examples, the device 110 may track the adaptive gain value when voice activity is detected and separately track a silence gain value for when voice activity is not detected. As illustrated in FIG. 12B, if voice activity is not detected in step 1214, the device 110 may determine (1254) a silence gain value. For example, the silence gain value may attenuate over time, such that the silence gain decreases with each audio frame when voice activity is not detected.

In some examples, in addition to determining that voice activity is detected, the device 110 may determine whether a signal-to-noise ratio (SNR) value is above a threshold. As illustrated in FIG. 12B, if voice activity is detected in step 1214, the device 110 may determine (1250) an SNR value and determine (1252) whether the SNR value is below a threshold value. If the SNR value is below the threshold value, the device 110 may loop to step 1254 and determine the silence gain value as described above. If the SNR value is above the threshold value, the device 110 may loop to step 1218 and perform steps 1218-1226 as normal.

Figure 13:
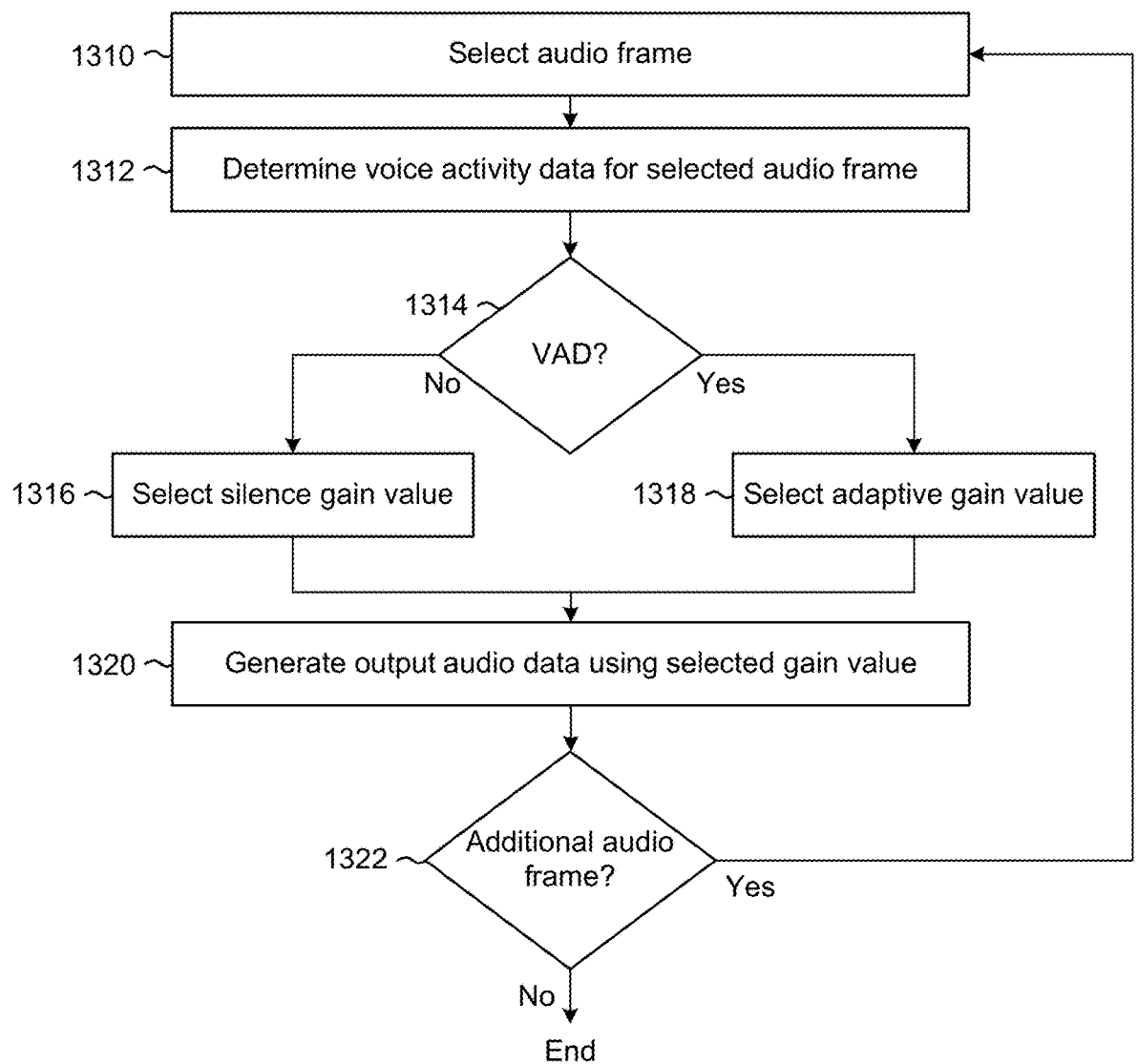
FIG. 13 is a flowchart conceptually illustrating an example method for generating output audio data using a selected gain value according to embodiments of the present disclosure.

FIG. 13 is a flowchart conceptually illustrating an example method for generating output audio data using a selected gain value according to embodiments of the present disclosure. As illustrated in FIG. 13, the device 110 may select (1310) an audio frame, determine (1312) voice activity data for the selected audio frame, and determine (1314) whether voice activity is detected. If voice activity is not detected, the device 110 may select (1316) a silence gain value, but if voice activity is detected, the device 110 may select (1318) an adaptive gain value. After selecting the gain value, the device 110 may generate (1320) output audio data using the selected gain value, determine (1322) whether there is an additional audio frame, and if so, may loop to step 1310 and repeat steps 1310-1322 for the additional audio frame.

FIG. 14 is a block diagram conceptually illustrating example components of the system 100. In operation, the system 100 may include computer-readable and computer-executable instructions that reside on the device 110, as will be discussed further below.

The device 110 may include one or more audio capture device(s), such as a microphone array 112 or individual microphones. The audio capture device(s) may be integrated into the device 110 or may be separate. The device 110 may also include an audio output device for producing sound, such as loudspeaker(s) 114. The audio output device may be integrated into the device 110 or may be separate. In some examples the device 110 may include a display, but the disclosure is not limited thereto and the device 110 may not include a display or may be connected to an external device/display without departing from the disclosure.

The device 110 may include an address/data bus 1424 for conveying data among components of the device 110. Each component within the device 110 may also be directly connected to other components in addition to (or instead of) being connected to other components across the bus 1424.

The device 110 may include one or more controllers/processors 1404, which may each include a central processing unit (CPU) for processing data and computer-readable instructions, and a memory 1406 for storing data and instructions. The memory 1406 may include volatile random access memory (RAM), non-volatile read only memory (ROM), non-volatile magnetoresistive (MRAM) and/or other types of memory. The device 110 may also include a data storage component 1408, for storing data and controller/processor-executable instructions. The data storage component 1408 may include one or more non-volatile storage types such as magnetic storage, optical storage, solid-state storage, etc. The device 110 may also be connected to removable or external non-volatile memory and/or storage (such as a removable memory card, memory key drive, networked storage, etc.) through the input/output device interfaces 1402.

Computer instructions for operating the device 110 and its various components may be executed by the controller(s)/processor(s) 1404, using the memory 1406 as temporary "working" storage at runtime. The computer instructions may be stored in a non-transitory manner in non-volatile memory 1406, storage 1408, or an external device. Alternatively, some or all of the executable instructions may be embedded in hardware or firmware in addition to or instead of software.

The device 110 includes input/output device interfaces 1402. A variety of components may be connected through the input/output device interfaces 1402, such as the microphone array 112, the loudspeaker(s) 114, and/or the display. The input/output interfaces 1402 may include A/D converters for converting the output of the microphone array 112 into microphone audio data, if the microphone array 112 is integrated with or hardwired directly to the device 110. If the microphone array 112 is independent, the A/D converters will be included with the microphone array 112, and may be clocked independent of the clocking of the device 110. Likewise, the input/output interfaces 1402 may include D/A converters for converting output audio data into an analog current to drive the loudspeakers 114, if the loudspeakers 114 are integrated with or hardwired to the device 110. However, if the loudspeakers 114 are independent, the D/A converters will be included with the loudspeakers 114 and may be clocked independent of the clocking of the device 110 (e.g., conventional Bluetooth loudspeakers).

The input/output device interfaces 1402 may also include an interface for an external peripheral device connection such as universal serial bus (USB), FireWire, Thunderbolt or other connection protocol. The input/output device interfaces 1402 may also include a connection to one or more networks 10 via an Ethernet port, a wireless local area network (WLAN) (such as WiFi) radio, Bluetooth, and/or wireless network radio, such as a radio capable of communication with a wireless communication network such as a Long Term Evolution (LTE) network, WiMAX network, 3G network, etc.

The concepts disclosed herein may be applied within a number of different devices and computer systems, including, for example, general-purpose computing systems, multimedia set-top boxes, televisions, stereos, radios, server-client computing systems, telephone computing systems, laptop computers, cellular phones, personal digital assistants (PDAs), tablet computers, wearable computing devices (watches, glasses, etc.), other mobile devices, etc.

The above aspects of the present disclosure are meant to be illustrative. They were chosen to explain the principles and application of the disclosure and are not intended to be exhaustive or to limit the disclosure. Many modifications and variations of the disclosed aspects may be apparent to those of skill in the art. Persons having ordinary skill in the field of digital signal processing should recognize that components and process steps described herein may be interchangeable with other components or steps, or combinations of components or steps, and still achieve the benefits and advantages of the present disclosure. Moreover, it should be apparent to one skilled in the art, that the disclosure may be practiced without some or all of the specific details and steps disclosed herein.

Aspects of the disclosed system may be implemented as a computer method or as an article of manufacture such as a memory device or non-transitory computer readable storage medium. The computer readable storage medium may be readable by a computer and may comprise instructions for causing a computer or other device to perform processes described in the present disclosure. The computer readable storage medium may be implemented by a volatile computer memory, non-volatile computer memory, hard drive, solid-state memory, flash drive, removable disk and/or other media.

As used in this disclosure, the term "a" or "one" may include one or more items unless specifically stated otherwise. Further, the phrase "based on" is intended to mean "based at least in part on" unless specifically stated otherwise.

What is claimed is:

1. A computer-implemented method, comprising:
receiving first audio data corresponding to speech;
determining that a first portion of the first audio data includes a first representation of the speech;
determining a first loudness measurement value of the first portion of the first audio data
determining, using the first loudness measurement value and a first decay rate value, a first loudness estimate value representing an estimated volume level of the first portion of the first audio data, the first decay rate value controlling how rapidly the estimated volume level decreases over time;
determining a first gain value by determining a first difference between a first target loudness value and the first loudness estimate value, the first target loudness value representing a desired volume level for the first portion of the first audio data;
generating a first portion of second audio data by applying the first gain value to the first portion of the first audio data;
determining that speech is not detected for a first duration of time following the first portion of the first audio data;
determining that the first duration of time exceeds a time threshold value;
selecting, based at least in part on the first duration of time exceeding the time threshold value, a second decay rate value that is larger than the first decay rate value, the second decay rate value increasing how rapidly the estimated volume level decreases over time relative to the first decay rate value;
determining that a second portion of the first audio data includes a second representation of the speech;
determining a second loudness measurement value of the second portion of the first audio data;
determining, using the second loudness measurement value and the second decay rate value, a second loudness estimate value;
determining a second gain value by determining a second difference between a second target loudness value and the second loudness estimate value; and
generating a second portion of the second audio data by applying the second gain value to the second portion of the first audio data.

2. The computer-implemented method of claim 1, further comprising:
determining that speech is not detected in a third portion of the first audio data;
determining a third loudness measurement value of the third portion of the first audio data;
determining, using the third loudness measurement value, a first noise estimate value representing an estimated noise floor of the third portion of the first audio data;
determining a third gain value corresponding to an absence of speech; and
generating a third portion of the second audio data by applying the third gain value to the third portion of the first audio data.

3. The computer-implemented method of claim 1, further comprising, prior to determining that the first portion of the first audio data includes the first representation of the speech:
determining that speech is detected for a second duration of time within the first audio data; and
selecting, in response to determining that speech is detected for the second duration of time, the first decay rate value,
wherein determining the first gain value further comprises:
determining a first noise estimate value representing an estimated noise floor of the first portion of the first audio data;
determining a first signal quality metric value of the first portion of the first audio data using the first loudness estimate value and the first noise estimate value;
determining that the first signal quality metric value is above a threshold value; and
determining the first difference between the first target loudness value and the first loudness estimate value.

4. The computer-implemented method of claim 1, further comprising:
determining that speech is detected for a second duration of time following the first duration of time;
selecting, in response to determining that speech is detected for the second duration of time, the first decay rate value;
determining that a third portion of the first audio data includes a third representation of the speech;
determining a third loudness measurement value of the third portion of the first audio data;
determining, using the third loudness measurement value and the first decay rate value, a third loudness estimate value;
determining a third gain value by determining a third difference between a third target loudness value and the third loudness estimate value;
generating a third portion of the second audio data by applying the third gain value to the third portion of the first audio data;
determining that the third loudness measurement value is lower than the third loudness estimate value;
selecting, in response to determining that that the third loudness measurement value is lower than the third loudness estimate value, the second decay rate value;
determining a fourth loudness measurement value of a fourth portion of the first audio data;
determining, using the fourth loudness measurement value and the second decay rate value, a fourth loudness estimate value;
determining a fourth gain value by determining a fourth difference between a fourth target loudness value and the fourth loudness estimate value; and
generating a fourth portion of the second audio data by applying the fourth gain value to the fourth portion of the first audio data.

5. A computer-implemented method, the method comprising:
receiving first audio data;
determining that a first portion of the first audio data represents first voice activity;
determining, using a first decay rate value, a first loudness estimate value corresponding to the first portion of the first audio data;
determining a first gain value corresponding to the first loudness estimate value;
generating a first portion of second audio data by applying the first gain value to the first portion of the first audio data;
determining absence of speech for a first duration of time;
determining that the first duration of time exceeds a time threshold value;
determining that a second portion of the first audio data represents second voice activity;
based at least in part on the first duration exceeding the time threshold value, determining a second decay rate value larger than the first decay rate value;
using the second decay rate value to determine a second loudness estimate value corresponding to the second portion of the first audio data, wherein the second decay rate value is larger than the first decay rate value;
determining a second gain value corresponding to the second loudness estimate value; and
generating a second portion of the second audio data by applying the second gain value to the second portion of the first audio data.

6. The computer-implemented method of claim 5, wherein determining the first loudness estimate value further comprises:
determining a third loudness estimate value corresponding to a third portion of the first audio data prior to the first portion of the first audio data;
determining a first loudness measurement value associated with the first portion of the first audio data; and
determining the first loudness estimate value by adjusting the third loudness estimate value based on the first loudness measurement value and the first decay rate value.

7. The computer-implemented method of claim 5, further comprising:
determining that a third portion of the first audio data represents non-speech activity;
determining a loudness measurement value associated with the third portion of the first audio data;
determining, using the loudness measurement value, a first noise estimate value;
determining a third gain value corresponding to the absence of speech; and
generating a third portion of the second audio data by applying the third gain value to the third portion of the first audio data.

8. The computer-implemented method of claim 5, further comprising:
determining that a third portion of the first audio data represents third voice activity;
determining a third loudness estimate value corresponding to the third portion of the first audio data;
determining, using at least the second loudness estimate value and the third loudness estimate value, a fourth loudness estimate value;
determining a first signal quality metric value associated with the third portion of the first audio data by dividing the fourth loudness estimate value by a noise estimate value;
determining that the first signal quality metric value is below a threshold value;
determining a third gain value corresponding to the absence of speech; and
generating a third portion of second audio data by applying the third gain value to the third portion of the first audio data.

9. The computer-implemented method of claim 5, wherein determining the first gain value further comprises:
determining a first signal quality metric value associated with the first portion of the first audio data based on the first loudness estimate value and a first noise estimate value;
determining that the first signal quality metric value is above a threshold value;
determining a target loudness value; and
determining the first gain value by calculating a difference between the target loudness value and the first loudness estimate value.

10. The computer-implemented method of claim 5, further comprising:
determining that speech is detected for a second duration of time following the second portion of the first audio data;
determining, using the first decay rate value, a third loudness estimate value corresponding to a third portion of the first audio data;
determining a third gain value corresponding to the third loudness estimate value; and
generating a third portion of the second audio data by applying the third gain value to the third portion of the first audio data.

11. The computer-implemented method of claim 5, further comprising:
determining that a third portion of the first audio data represents third voice activity;
determining a first loudness measurement value associated with the third portion of the first audio data;
determining, using the first loudness measurement value and the first decay rate value, a third loudness estimate value corresponding to the third portion of the first audio data;
determining that the first loudness measurement value is lower than the third loudness estimate value;
determining that a fourth portion of the first audio data represents fourth voice activity; and
determining, using the second decay rate value, a fourth loudness estimate value corresponding to the fourth portion of the first audio data.

12. The computer-implemented method of claim 5, further comprising:
determining an amount of gain associated with performing residual echo suppression to generate a third portion of the first audio data;
determining that the amount of gain is below a threshold value;
determining a third gain value corresponding to the absence of speech; and
generating a third portion of the second audio data by applying the third gain value to the third portion of the first audio data.

13. A system comprising:
at least one processor; and memory including instructions operable to be executed by the at least one processor to cause the system to:
receive first audio data;
determine that a first portion of the first audio data represents first voice activity;
determine, using a first decay rate value, a first loudness estimate value corresponding to the first portion of the first audio data;
determine a first gain value corresponding to the first loudness estimate value;
generate a first portion of second audio data by applying the first gain value to the first portion of the first audio data;
determine absence of speech for a first duration of time;
determine that the first duration of time exceeds a time threshold value;
determine that a second portion of the first audio data represents second voice activity;
based at least in part on the first duration exceeding the time threshold value, determine a second decay rate value larger than the first decay rate value;
use the second decay rate value to determine a second loudness estimate value corresponding to the second portion of the first audio data, wherein the second decay rate value is larger than the first decay rate value;
determine a second gain value corresponding to the second loudness estimate value; and
generate a second portion of the second audio data by applying the second gain value to the second portion of the first audio data.

14. The system of claim 13, wherein the memory further comprises instructions that, when executed by the at least one processor, further cause the system to:
determine a third loudness estimate value corresponding to a third portion of the first audio data prior to the first portion of the first audio data;
determine a first loudness measurement value associated with the first portion of the first audio data; and
determine the first loudness estimate value by adjusting the third loudness estimate value based on the first loudness measurement value and the first decay rate value.

15. The system of claim 13, wherein the memory further comprises instructions that, when executed by the at least one processor, further cause the system to:
determine that a third portion of the first audio data represents non-speech activity;
determine a loudness measurement value associated with the third portion of the first audio data;
determine, using the loudness measurement value, a first noise estimate value;
determine a third gain value corresponding to the absence of speech; and
generate a third portion of the second audio data by applying the third gain value to the third portion of the first audio data.

16. The system of claim 13, wherein the memory further comprises instructions that, when executed by the at least one processor, further cause the system to:
determine that a third portion of the first audio data represents third voice activity;
determine a third loudness estimate value corresponding to the third portion of the first audio data;
determine, using at least the second loudness estimate value and the third loudness estimate value, a fourth loudness estimate value;
determine a first signal quality metric value associated with the third portion of the first audio data by dividing the fourth loudness estimate value by a noise estimate value;
determine that the first signal quality metric value is below a threshold value;
determine a third gain value corresponding to the absence of speech; and
generate a third portion of second audio data by applying the third gain value to the third portion of the first audio data.

17. The system of claim 13, wherein the memory further comprises instructions that, when executed by the at least one processor, further cause the system to:
determine a first signal quality metric value associated with the first portion of the first audio data based on the first loudness estimate value and a first noise estimate value;
determine that the first signal quality metric value is above a threshold value;
determine a target loudness value; and
determine the first gain value by calculating a difference between the target loudness value and the first loudness estimate value.

18. The system of claim 13, wherein the memory further comprises instructions that, when executed by the at least one processor, further cause the system to:
determine that speech is detected for a second duration of time following the second portion of the first audio data;
determine, using the first decay rate value, a third loudness estimate value corresponding to a third portion of the first audio data;
determine a third gain value corresponding to the third loudness estimate value; and
generate a third portion of the second audio data by applying the third gain value to the third portion of the first audio data.

19. The system of claim 13, wherein the memory further comprises instructions that, when executed by the at least one processor, further cause the system to:
determine that a third portion of the first audio data represents third voice activity;
determine a first loudness measurement value associated with the third portion of the first audio data;
determine, using the first loudness measurement value and the first decay rate value, a third loudness estimate value corresponding to the third portion of the first audio data;
determine that the first loudness measurement value is lower than the third loudness estimate value;
determine that a fourth portion of the first audio data represents fourth voice activity; and
determine, using the second decay rate value, a fourth loudness estimate value corresponding to the fourth portion of the first audio data.

20. The system of claim 13, wherein the memory further comprises instructions that, when executed by the at least one processor, further cause the system to:
determine an amount of gain associated with performing residual echo suppression to generate a third portion of the first audio data;
determine that the amount of gain is below a threshold value;
determine a third gain value corresponding to the absence of speech; and generate a third portion of the second audio data by applying the third gain value to the third portion of the first audio data.

\* \* \* \* \*